(12) United States Patent
Pachamuthu et al.

(10) Patent No.: US 9,230,979 B1
(45) Date of Patent: Jan. 5, 2016

(54) HIGH DIELECTRIC CONSTANT ETCH STOP LAYER FOR A MEMORY STRUCTURE

(71) Applicant: SanDisk Technologies, Inc., Plano, TX (US)

(72) Inventors: Jayavel Pachamuthu, San Jose, CA (US); Johann Alsmeier, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/530,220

(22) Filed: Oct. 31, 2014

(51) Int. Cl.
*H01L 29/76* (2006.01)
*H01L 27/115* (2006.01)
*H01L 21/311* (2006.01)

(52) U.S. Cl.
CPC .... *H01L 27/11575* (2013.01); *H01L 21/31111* (2013.01); *H01L 21/31144* (2013.01); *H01L 27/1157* (2013.01); *H01L 27/11582* (2013.01)

(58) Field of Classification Search
CPC ............ H01L 27/11521; H01L 27/11524; H01L 27/11529; H01L 29/76
USPC ............ 438/257–267, 396; 257/314–321
See application file for complete search history.

(56) References Cited

U.S. PATENT DOCUMENTS

| | | | |
|---|---|---|---|
| 5,915,167 A | 6/1999 | Leedy | |
| 5,985,753 A | 11/1999 | Yu et al. | |
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |

(Continued)

FOREIGN PATENT DOCUMENTS

| KR | 10-2009-0001377 A | 1/2009 |
|---|---|---|
| WO | WO02/15277 A2 | 2/2002 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Brook Kebede
(74) *Attorney, Agent, or Firm* — The Marbury Law Group PLLC

(57) ABSTRACT

A high dielectric constant (high-k) dielectric material layer having a dielectric constant greater than 7.9 is formed a substrate. A stack of alternating layers comprising first material layers and second material layers is formed over the high-k dielectric material layer. A memory opening is formed through the stack employing a top surface of the high-k dielectric material layer as an etchstop layer, thereby minimizing an overetch. A memory film and a semiconductor channel are subsequently formed. During formation of a backside contact trench, the high-k dielectric material layer can be employed as an etch stop layer. Thus, the high-k dielectric material layer can be employed as a common etch stop layer for formation of the memory opening and the backside contact trench.

37 Claims, 21 Drawing Sheets

(56) References Cited

U.S. PATENT DOCUMENTS

| | | |
|---|---|---|
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,349,681 B2 | 1/2013 | Alsmeier et al. |
| 8,445,347 B2 | 5/2013 | Alsmeier |
| 8,614,126 B1 | 12/2013 | Lee et al. |
| 8,828,884 B2 | 9/2014 | Lee et al. |
| 2002/0168849 A1 | 11/2002 | Lee et al. |
| 2006/0068592 A1 | 3/2006 | Dostalik |
| 2007/0210338 A1 | 9/2007 | Orlowski |
| 2007/0252201 A1 | 11/2007 | Kito et al. |
| 2008/0258308 A1 | 10/2008 | Liu et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0178759 A1* | 7/2010 | Kim .................. H01L 27/11521 438/591 |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0031547 A1 | 2/2011 | Watanabe |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2011/0291177 A1 | 12/2011 | Lee et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0001252 A1 | 1/2012 | Alsmeier et al. |
| 2012/0034785 A1 | 2/2012 | Hayashi et al. |
| 2012/0086072 A1* | 4/2012 | Yun .................. H01L 27/11578 257/329 |
| 2012/0146122 A1 | 6/2012 | Whang et al. |
| 2012/0146127 A1 | 6/2012 | Lee et al. |
| 2012/0146422 A1 | 6/2012 | Meehi et al. |
| 2012/0199897 A1 | 8/2012 | Chang et al. |
| 2012/0256247 A1 | 10/2012 | Alsmeier |
| 2013/0069139 A1 | 3/2013 | Ishihara et al. |
| 2013/0069140 A1 | 3/2013 | Ichinose et al. |
| 2013/0264631 A1 | 10/2013 | Alsmeier |
| 2014/0264533 A1 | 9/2014 | Simsek-Ege et al. |
| 2014/0264542 A1 | 9/2014 | Simsek-Ege et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Geil et al., "Etch Resistance of Focused-Ion-Beam-Implanted $SiO_2$," LEOS 1991: Summer Topical Meetings on Epitaxial Materials and In-situ Processing for Optoelectronic Devices, Jul. 29-31, 1991 and Microfabrication for Photonics and Optoelectronics, Jul. 31-Aug. 2, 1991.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

Qian et al., "Fabrication of Si Microstructures Using Focused Ion Beam Implantation and Reactive Ion Etching," 2008 J. Micromech. Microeng. 18, 035003, 5pgs.

Sievila et al., "The Fabrication of Silicon Nanostructures by Focused-Ion-Beam Implantation and TMAH Wet Etching," 2010 Nanotechnology, 21, 145301, 6pgs.

Chekurov et al., "The Fabrication of Silicon Nanostructures by Local Gallium Implantation and Cryogenic Deep Reactive Ion Etching," 2009 Nanotechnology, 20, 065307, 5pgs.

Invitation to Pay Additional Fees, International Application No. PCT/US2013/049758, dated Oct. 10, 2013, 6pgs.

International Search Report and Written Opinion received in connection with international application No. PCT/US2014/044833; mailed Oct. 2, 2014.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 13/544,328, filed Jul. 9, 2012, SanDisk Technologies Inc.

U.S. Appl. No. 13/754,293, filed Jan. 30, 2013, SanDisk Technologies Inc.

U.S. Appl. No. 13/933,236, filed Jul. 2, 2013, SanDisk Technologies Inc.

U.S. Appl. No. 14/341,079, filed Jul. 25, 2014, SanDisk Technologies Inc.

U.S. Appl. No. 62/004,990, filed May 30, 2014, SanDisk Technologies Inc.

* cited by examiner

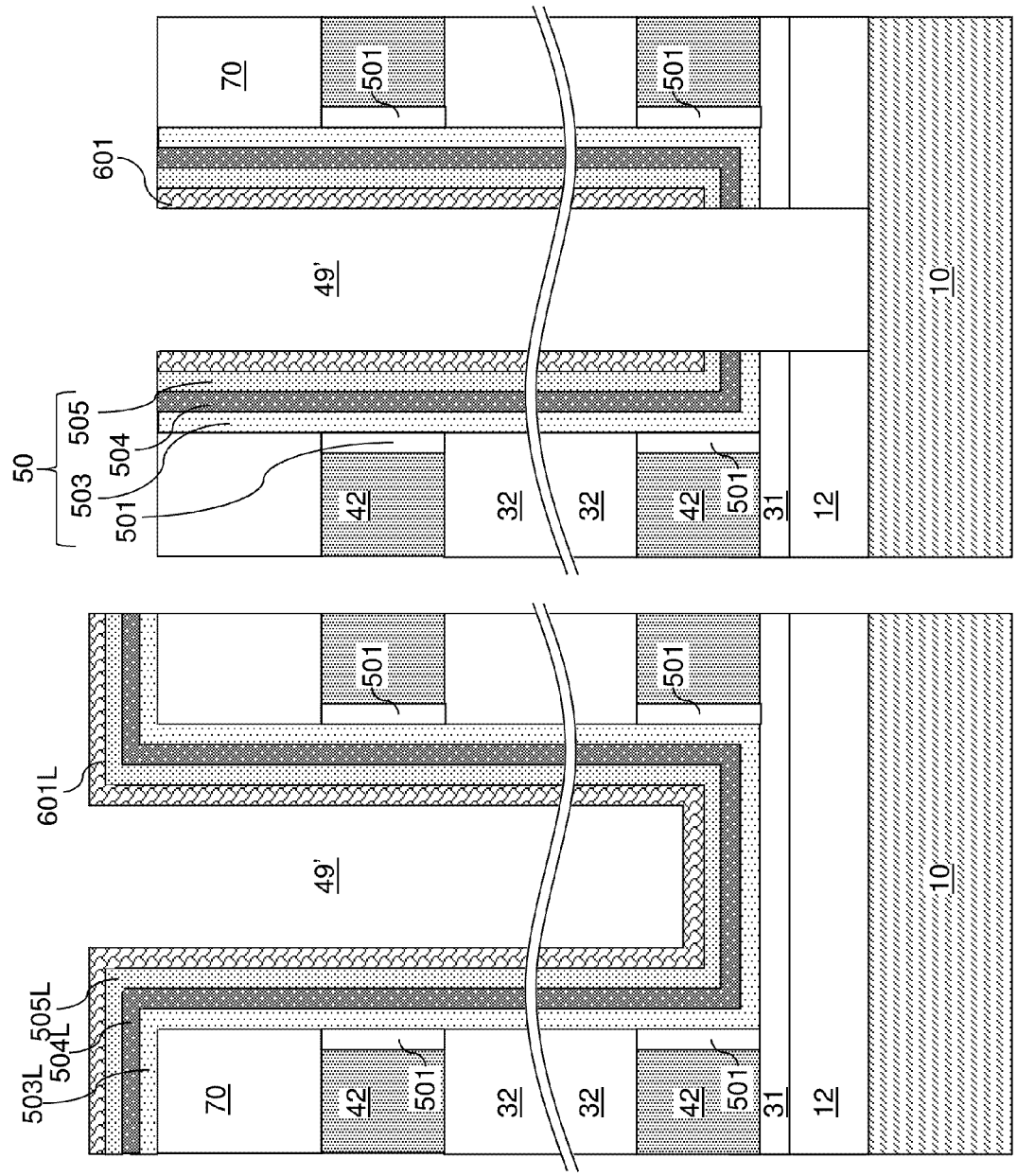

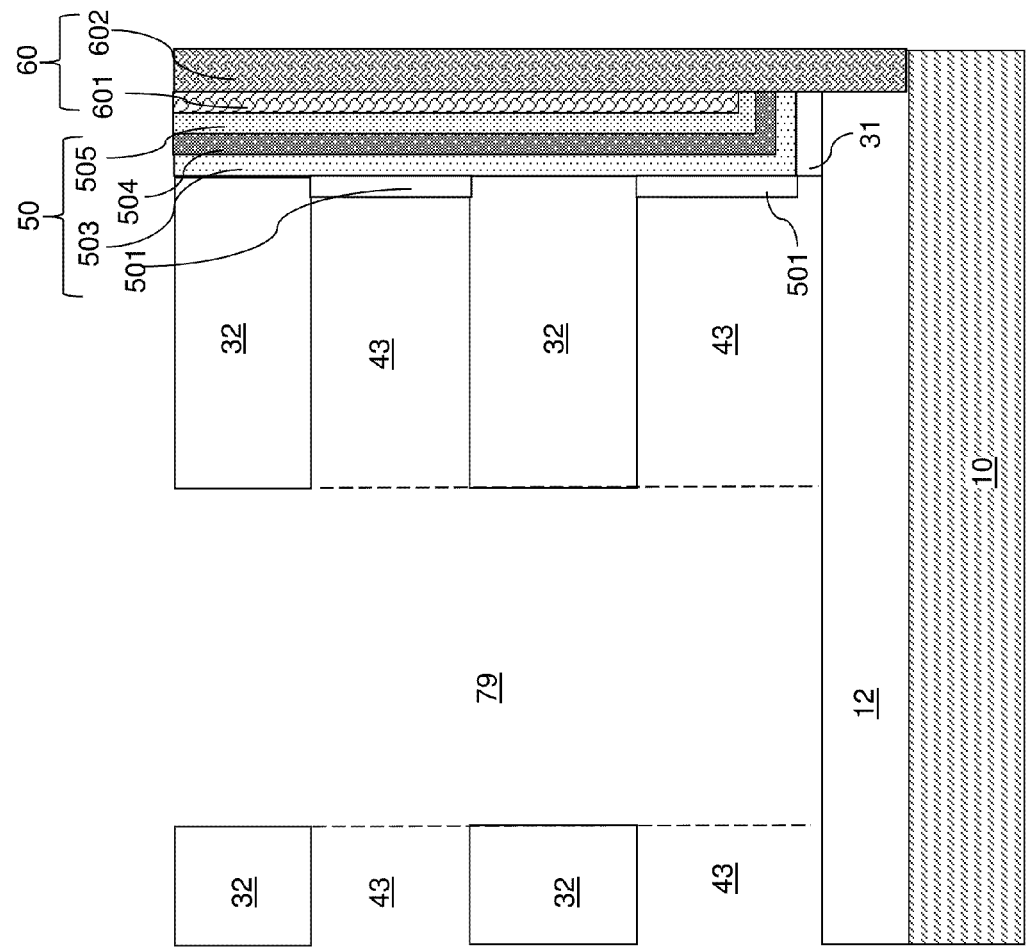

HIGH DIELECTRIC CONSTANT ETCH STOP LAYER FOR A MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises a high dielectric constant (high-k) dielectric material layer having a dielectric constant greater than 7.9 and located over a substrate, a stack of alternating layers comprising insulator layers and electrically conductive layers and located over the high-k dielectric material layer, a memory opening extending through the stack, and a memory film and a semiconductor channel located within the memory opening. The memory film is in contact with a top surface of the high-k dielectric material layer. A portion of the semiconductor channel extends through an opening in the high-k dielectric material layer and contacts a semiconductor material within the substrate.

According to another aspect of the present disclosure, a method of manufacturing a three-dimensional memory structure is provided. A high dielectric constant (high-k) dielectric material layer having a dielectric constant greater than 7.9 is formed over a substrate. A stack of alternating layers comprising first material layers and second material layers is formed over the high-k dielectric material layer. A memory opening is formed through the stack employing a top surface of the high-k dielectric material layer as an etchstop layer. A memory film is formed in the memory opening. A semiconductor channel is formed on the memory film. The semiconductor channel extends through an opening in the high-k dielectric material layer and contacts a semiconductor material in the substrate.

BRIEF DESCRIPTION OF THE DRAWINGS

FIGS. 2A-2F are sequential vertical cross-sectional views of a memory opening within the exemplary structure during various processing steps employed to form a memory stack structure according to an embodiment of the present disclosure.

FIGS. 6A-6E are sequential vertical cross-sectional views of a magnified region M in FIGS. 5A and 5B during formation of electrically conductive layers according to a first embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
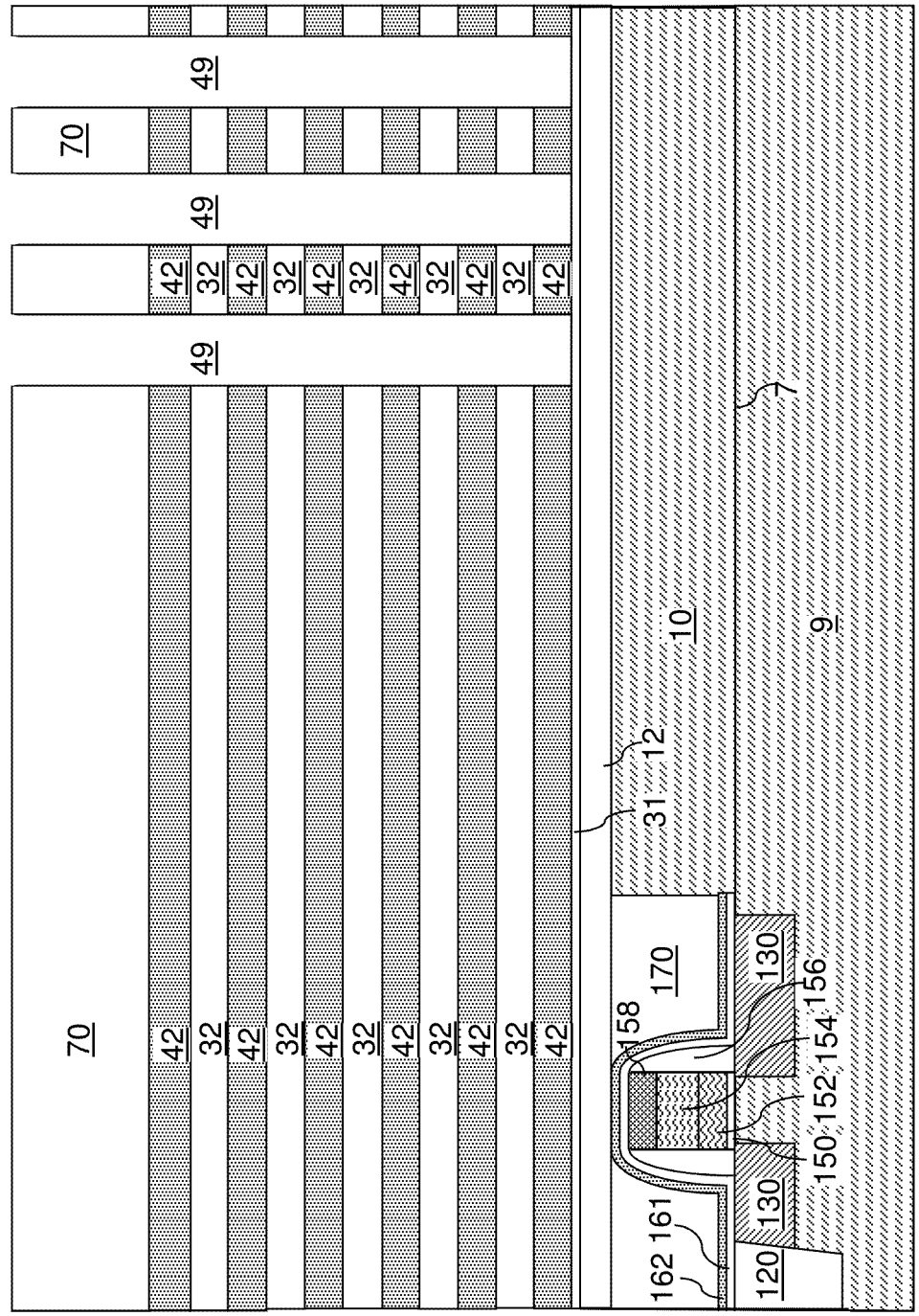
FIG. 1 is a vertical cross-sectional view of an exemplary structure after formation of a stack including an alternating plurality of material layers and memory openings extending through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical resistivity in the range from $1.0 \times 10^{-2}$ Ohm-cm to $1.0 \times 10^{7}$ Ohm-cm. As used herein, a "conductive material" refers to a material having electrical resistivity less than $1.0 \times 10^{-4}$, such as less than $1.0 \times 10^{-6}$ Ohm-cm. As used herein, an "insulator material" or a "dielectric material" refers to a material having electrical resistivity greater than $1.0 \times 10^{10}$ Ohm-cm. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The at least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. In one embodiment, a lower select gate structure (not shown) can be optionally formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure can include a gate dielectric and a gate electrode.

A high dielectric constant dielectric material layer 31, or a "high-k dielectric material" layer 31 is formed on a top surface of the dielectric pad layer 12 if the dielectric pad layer 12 is present, or on a top surface of the substrate (9, 10) if a dielectric pad layer 12 is not present. A "high dielectric constant dielectric material" or a "high-k dielectric material" refers to a dielectric material having a dielectric constant greater than the dielectric constant of stoichiometric silicon nitride, i.e., $Si_3N_4$, which is 7.9. The high-k dielectric material layer 31 includes a high-k dielectric material.

In one embodiment, the high-k dielectric material of the high-k dielectric material layer 31 can be a dielectric metal oxide, i.e., a dielectric compound of oxygen and at least one elemental metal selected from transition elements, Lanthanides, Actinides, and aluminum, and optionally at least another element such as nitrogen. Exemplary high-k dielectric materials include, but are not limited to, hafnium oxide, zirconium oxide, aluminum oxide, lanthanum oxide, tantalum oxide, silicates thereof, oxynitrides derived therefrom, mixtures thereof, and stacks thereof. In one embodiment, the high-k dielectric material layer 31 can be an aluminum oxide layer. The high-k dielectric material layer 31 can be formed by atomic layer deposition (ALD), pulsed laser deposition (PLD), metal organic chemical vapor deposition (MOCVD), or a combination thereof. The thickness of the high-k dielectric material layer 31 can be in a range from 3 nm to 15 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the high-k dielectric material layer 31. A bottommost surface of the stack (32, 42) can be formed on a topmost surface of the high-k dielectric material layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the high-k dielectric material layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The chemistry of the anisotropic etch that etches the bottommost layer among the alternating stack (32, 42) (which can be a bottommost sacrificial material layer 42 or a bottommost insulator layer 32) can be selective to the high-k dielectric material of the high-k dielectric material layer 31. The bottommost surface of each memory openings 49 can be coplanar with the topmost surface of the high-k dielectric material layer 31, or can be recessed relative to the topmost surface of the high-k dielectric material layer 31 by a vertical distance that is less than the thickness of the high-k dielectric material layer 31. Thus, the bottommost surface of each memory opening 39 can be a top surface of the high-k dielectric material layer 31. Thus, the high-k dielectric material layer 31 can be employed as an etchstop layer for the anisotropic etch process.

Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening 49 within the exemplary structure during formation of an exemplary memory stack structure according to an embodiment of the present disclosure. Formation of the exemplary memory stack structure can be performed within each of the memory openings 49 in the exemplary structure illustrated in FIG. 1.

Figure 2A:
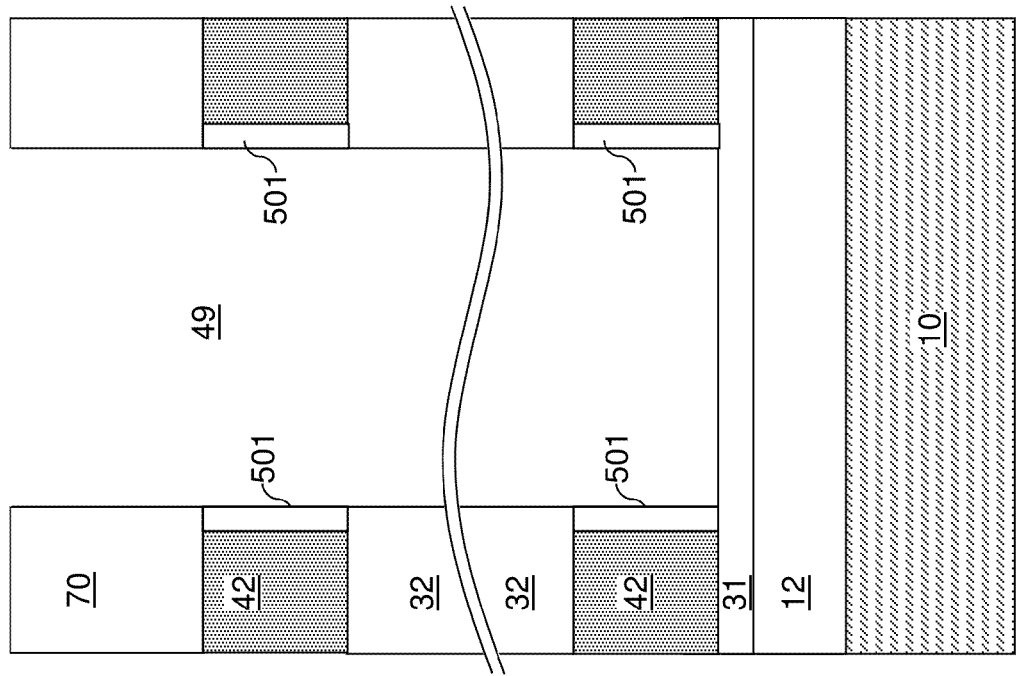

Referring to FIG. 2A, a memory opening 49 is illustrated in a magnified view. The memory opening 49 extends through the insulating cap layer 70 and through the alternating stack (32, 42), and to a top surface of the high-k dielectric material layer 31.

Figure 2B:
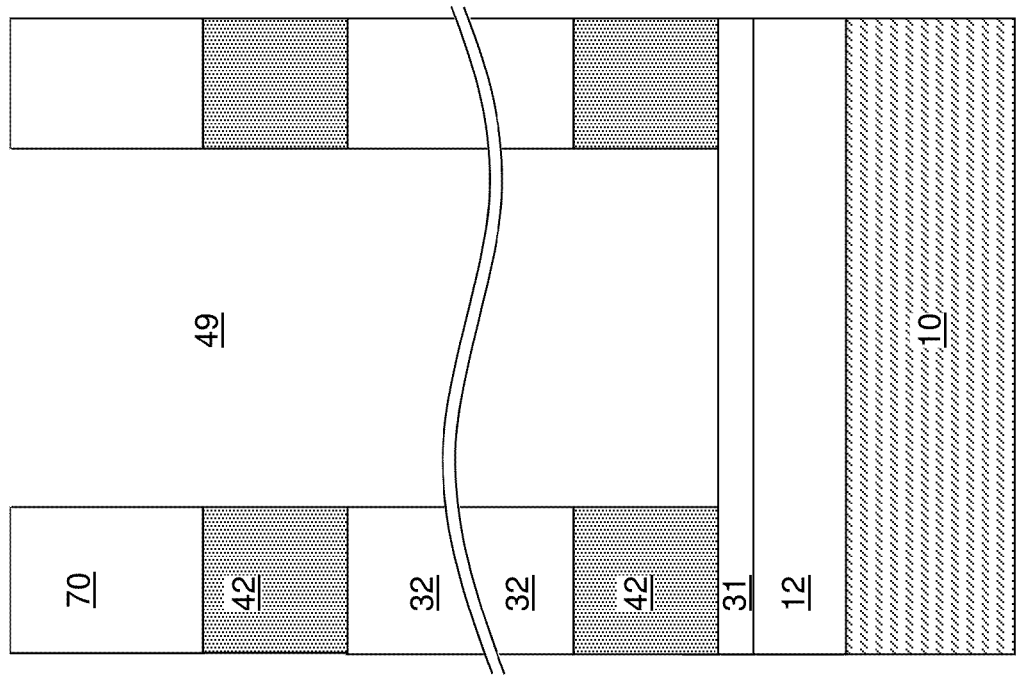

Referring to FIG. 2B, a plurality of blocking dielectric portions 501 can be optionally formed. In one embodiment, the sacrificial material layers 42 can comprise silicon nitride, and the insulator layers 32 and the insulating cap layer 70 can include silicon oxide. In this case, an in-situ steam generation (ISSG) oxidation process, a thermal oxidation process and/or a plasma oxidation process can be performed to convert surface portions of the sacrificial material layers 42 at the periphery of each memory opening 49 into silicon oxide portions or silicon oxynitride portions. Each silicon oxide portion or silicon oxynitride portion derived from the silicon nitride material of the sacrificial material layers 42 is herein referred to as a blocking dielectric portion 501, which is subsequently employed to block a leakage current from charge storage elements to control gate electrodes. In one embodiment, each blocking dielectric portion 501 can comprises a silicon oxynitride or silicon oxide, and has an annular shape, i.e., the shape of a ring. The lateral thickness of each blocking dielectric portion 501 can be in a range from 3 nm to 12 nm, although lesser and greater thicknesses can also be employed.

Referring to FIG. 2C, a series of layers including a blocking dielectric layer 503L, a memory material layer 504L, a tunneling dielectric layer 505L, and an optional first semiconductor channel layer 601L can be sequentially deposited in the memory openings 49.

The blocking dielectric layer 503L can be deposited directly on a top surface of the high-k dielectric material layer and directly on the sidewalls of each memory opening 49 by a conformal deposition method. The blocking dielectric layer 503L includes a dielectric material. In one embodiment, the dielectric material of the blocking dielectric layer 503 can be a high-k dielectric material such as a dielectric metal oxide. The dielectric metal oxide may consist essentially of the at least one metallic element and oxygen, or may consist essentially of the at least one metallic element, oxygen, and at least one non-metallic element such as nitrogen.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The composition of the blocking dielectric layer 503L may be the same as, or may be different from, the composition of the blocking dielectric portions 501. The blocking dielectric layer 503L can be deposited, for example, by chemical vapor deposition (CVD), atomic layer deposition (ALD), pulsed laser deposition (PLD), liquid source misted chemical deposition, or a combination thereof. The thickness of the blocking dielectric layer 503L can be in a range from 1 nm to 20 nm, although lesser and greater thicknesses can also be employed. The blocking dielectric layer 503L can subsequently function as a dielectric material portion that blocks leakage of stored electrical charges to control gate electrodes. In one embodiment, the blocking dielectric layer 503L includes aluminum oxide.

Subsequently, the memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed. The memory material layer 504L constitutes a plurality of charge storage elements that are formed on an inner sidewall of the blocking dielectric layer 503L.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (SOIL, 503L, 504L, 5051, 601L).

Referring to FIG. 2D, the optional first semiconductor channel layer 601L, the tunneling dielectric layer 505L, the memory material layer 504L, and the blocking dielectric layer 503L are sequentially anisotropically etched employing at least one anisotropic etch process. The portions of the first semiconductor channel layer 601L, the tunneling dielectric layer 505L, the memory material layer 504L, and the blocking dielectric layer 503L located above the top surface of the insulating cap layer 70 can be removed by the at least one anisotropic etch process. Further, the horizontal portions of the first semiconductor channel layer 601L, the tunneling dielectric layer 505L, the memory material layer 504L, and the blocking dielectric layer 503L at a bottom of each cavity 49' can be removed to form openings in remaining portions thereof. Each of the first semiconductor channel layer 601L, the tunneling dielectric layer 505L, the memory material layer 504L, and the blocking dielectric layer 503L can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as at least one charge storage element 504. In one embodiment, the at least one charge storage element 504 can be a contiguous layer, i.e., can be a charge storage layer. Each remaining portion of the blocking dielectric layer 503L is herein referred to as a blocking dielectric layer 503. Each adjoining set of a plurality of blocking dielectric portions 501, a blocking dielectric layer 503, at least one charge storage element 504, and a tunneling dielectric 505 collectively constitute a memory film 50, which can store electrical charges with a macroscopic retention time.

The anisotropic etch can be continued with a series of etch chemistries selected to consecutively etch the materials of the high-k dielectric material layer 31 and the dielectric pad layer 12. An extension of the memory opening is formed by the anisotropic etch of the high-k dielectric material layer 31 and the dielectric pad layer 12. The anisotropic etch employs at least the memory film 50 as an etch mask, and can employ the combination of the insulating cap layer 70, the memory film 50, and a vertical portion of the first semiconductor channel portion 601 as the etch mask. The extension of the memory opening can extend to a top surface of the substrate (9, 10).

The top surface of the semiconductor material layer 10 can be physically exposed underneath the extension of the memory opening through the first semiconductor channel portion 601, the tunneling dielectric 505, the at least one charge storage element 504, and the blocking dielectric layer 503. Optionally, the physically exposed semiconductor surface at the bottom of each cavity 49' (which includes the vertically extended portion through the high-k dielectric material layer 31 and the dielectric pad layer 12) may, or may not, be vertically recessed so that the recessed semiconductor surface underneath the cavity 49' is vertically offset from the topmost surface of the semiconductor material layer 10 by a recess distance. In one embodiment, the vertical recessing of the semiconductor surface below the cavity 49' can be minimized by selecting an etch chemistry that is selective to the material of the semiconductor material layer 10 during the etching of the dielectric pad layer. In an illustrative example, the dielectric pad layer 12 can comprise silicon oxide, and an anisotropic etch employing a HF based etch chemistry can be employed to etch the dielectric pas layer 12 to minimize the recessing of the top surface of the semiconductor material layer 10. In one embodiment, the bottom surface of the cavity 49' can be coplanar with the topmost surface of the semiconductor material layer 10.

In one embodiment, the first semiconductor channel portion 601, the tunneling dielectric 505, the at least one charge storage element 504, the blocking dielectric layer 503, and the plurality of blocking dielectric portions 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2F:
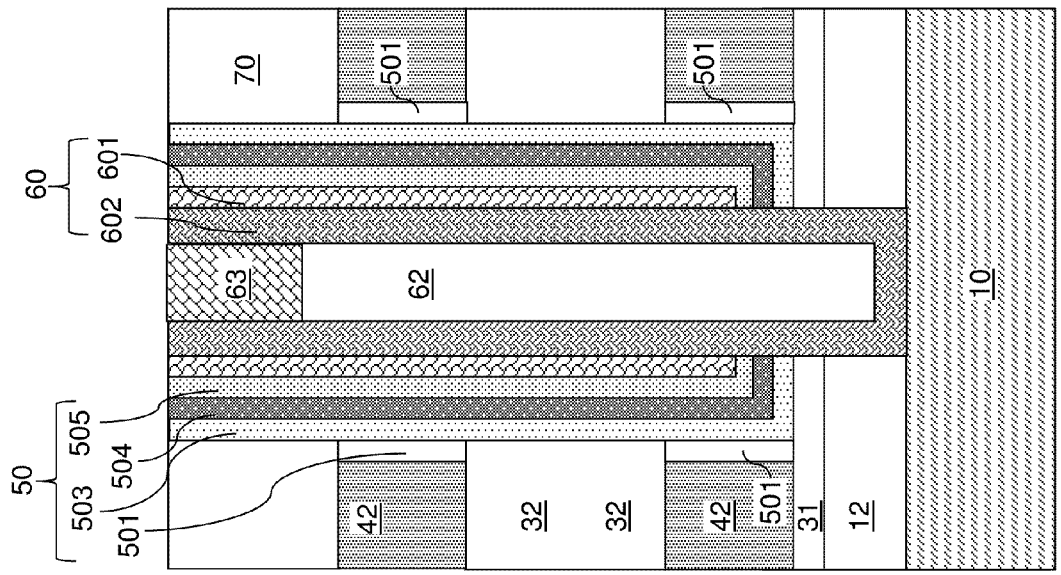
Figure 2E:
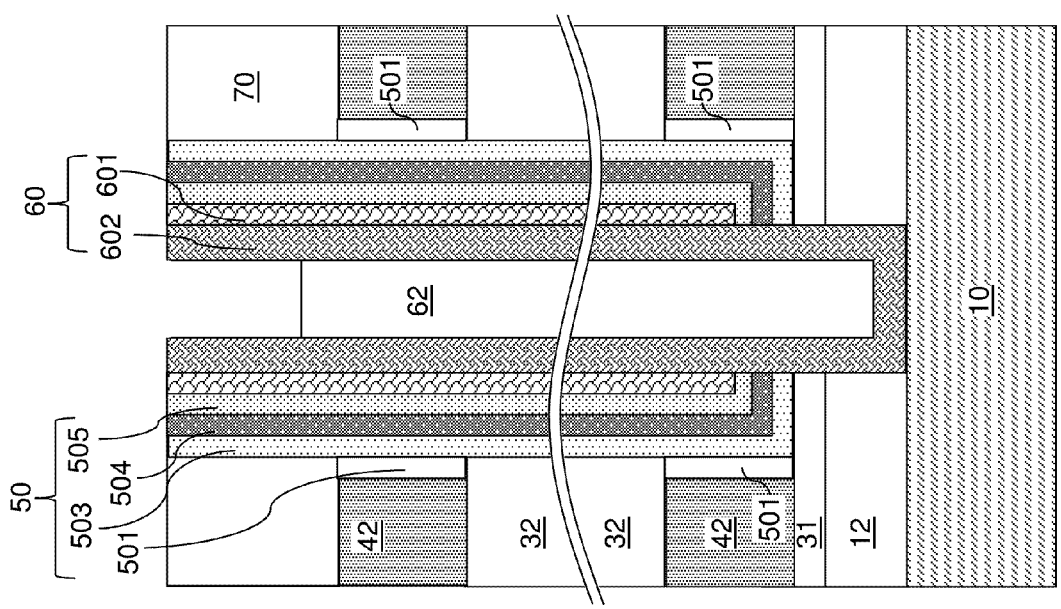

Referring to FIG. 2E, a second semiconductor channel layer can be deposited directly on the semiconductor surface of the semiconductor material layer 10 in the substrate (9, 10), and directly on the first semiconductor channel portion 601. The second semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer includes amorphous silicon or polysilicon. The second semiconductor channel layer can be formed by a conformal deposition method such as low pressure chemical vapor deposition (LPCVD). The thickness of the second semiconductor channel layer can be in a range from 2 nm to 10 nm, although lesser and greater thicknesses can also be employed. The second semiconductor channel layer may partially fill the cavity 49' in each memory opening, or may fully fill the cavity in each memory opening.

The materials of the first semiconductor channel portion 601 and the second semiconductor channel layer are collectively referred to as a semiconductor channel material. In other words, the semiconductor channel material is a set of all semiconductor material in the first semiconductor channel portion 601 and the second semiconductor channel layer.

In case the cavity 49' in each memory opening is not completely filled by the second semiconductor channel layer, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70. Further, the horizontal portion of the second semiconductor channel layer located above the top surface of the insulating cap layer 70 can be removed by a planarization process, which can employ a recess etch or chemical mechanical planarization (CMP). Each remaining portion of the second semiconductor channel layer within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within at least one charge storage element 504, and laterally surrounds a portion of the semiconductor channel 60. In some embodiments, a plurality of blocking dielectric portions 501 and/or a blocking dielectric layer 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours. The semiconductor channel 60 extends through an opening in the high-k dielectric material layer 31 and contacts a semiconductor material in the substrate (9, 10). An outer sidewall of the semiconductor channel 60 contacts a vertical sidewall at an opening through the high-k dielectric material layer 31.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62.

Referring to FIG. 2F, a drain region 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
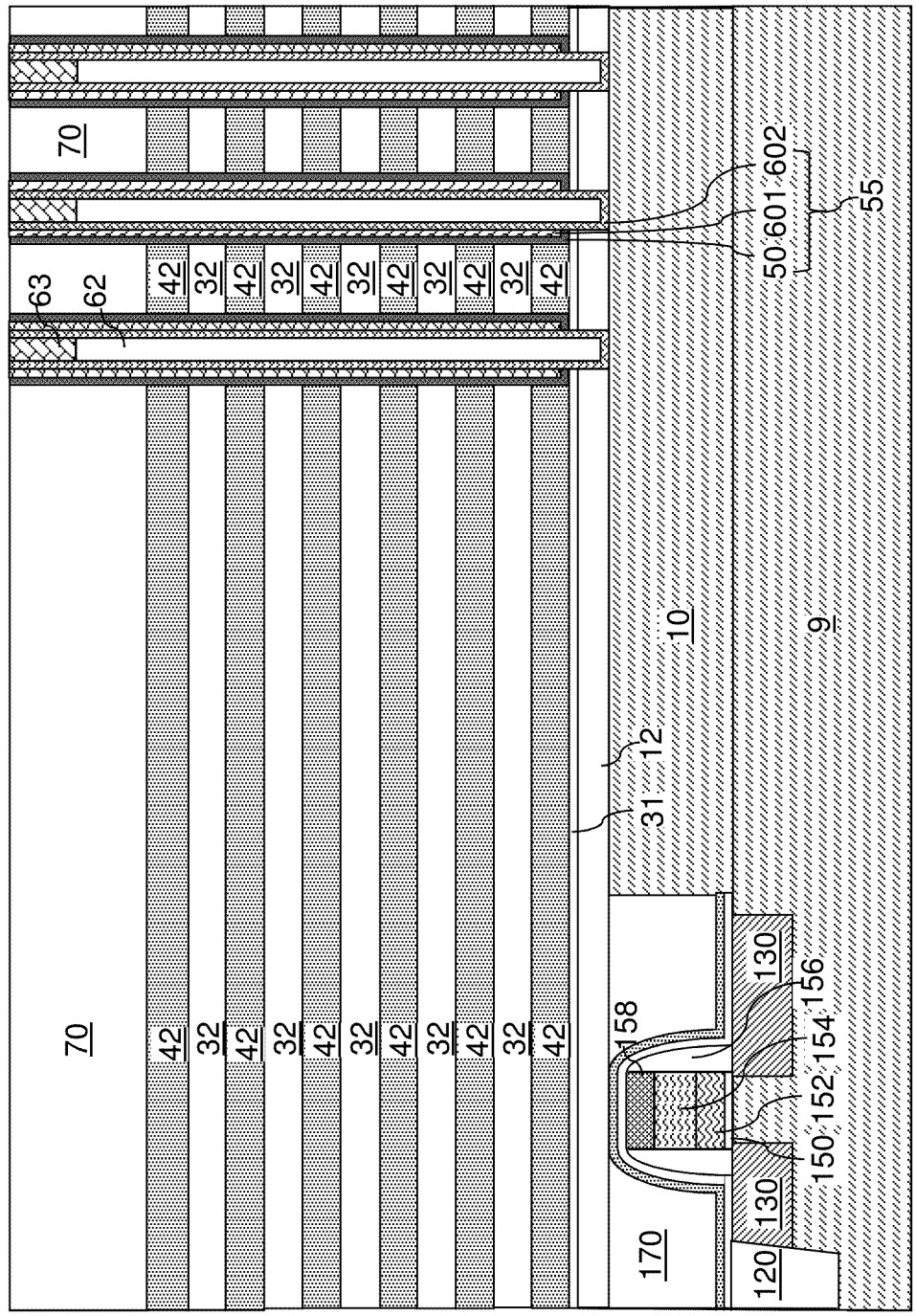
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises blocking dielectric portions 501 (See FIG. 2F) vertically extending from a bottommost layer (e.g., the bottommost sacrificial material layer 42) of the stack to a topmost layer (e.g., the topmost sacrificial material layer 42) of the stack, and contacting a sidewall of the memory opening. While the present disclosure is described employing the illustrated configuration for the memory stack structure, the methods of the present disclosure can be applied to alternative memory stack structures including a polycrystalline semiconductor channel.

Figure 4:
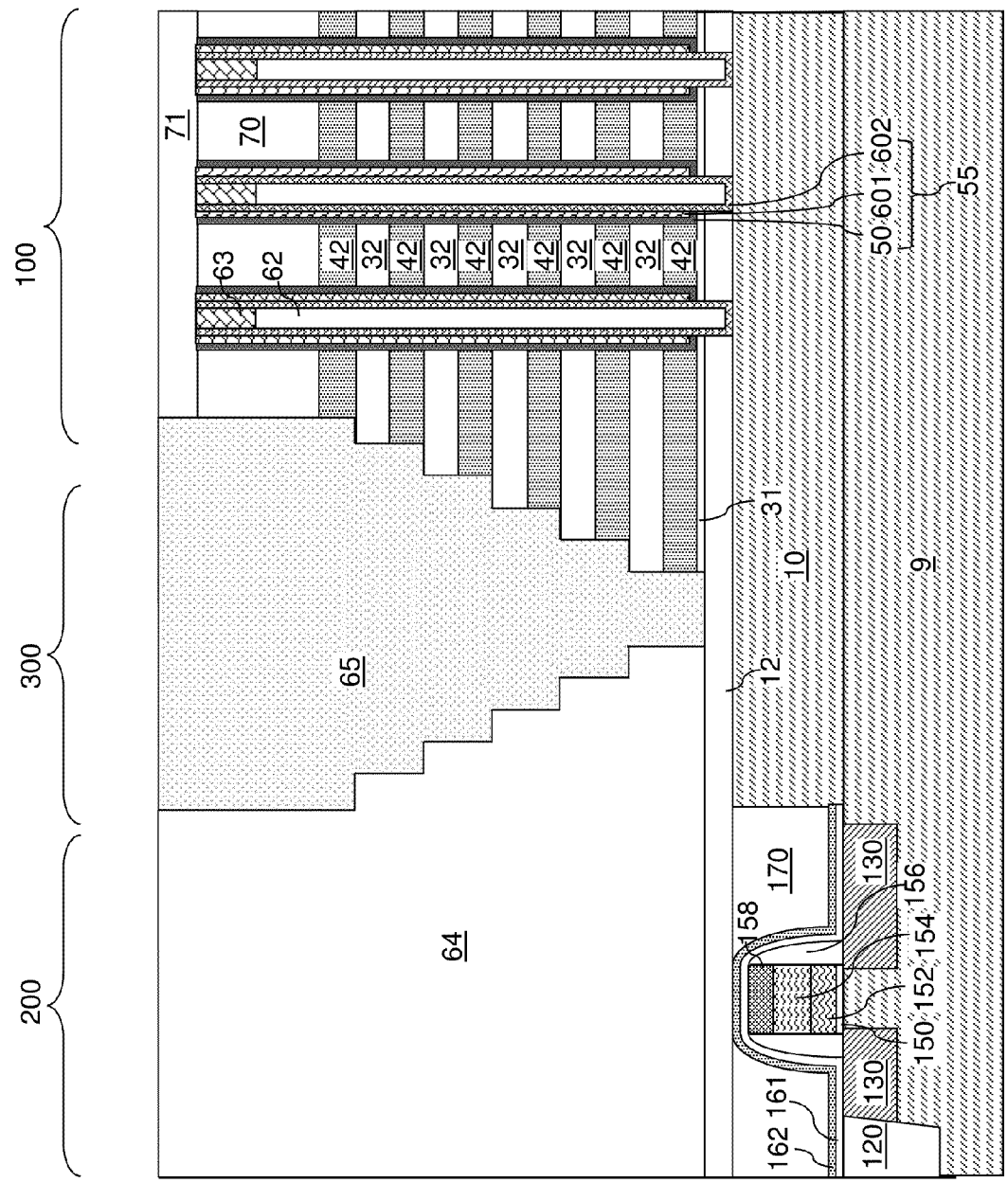
FIG. 4 is a vertical cross-sectional view of the exemplary structure after formation of a set of stepped surfaces and a retro-stepped dielectric material portion according to an embodiment of the present disclosure.

Referring to FIG. 4, at least one dielectric cap layer 71 can be optionally formed over the planarization dielectric layer 70. In one embodiment, the at least one dielectric cap layer 71 can include dielectric materials through which deuterium atoms can permeate. For example, the at least one dielectric cap layer can include silicon oxide and/or a dielectric metal oxide.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. In one embodiment, the high-k dielectric material layer 31 can be employed as an etchstop layer during formation of the trench, i.e., during the removal of the materials of the alternating stack (32, 42) within the area of the trench. Thus, the high-k dielectric material layer can be employed as a common etch stop layer for formation of the memory opening 49 and the backside contact trench 79. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
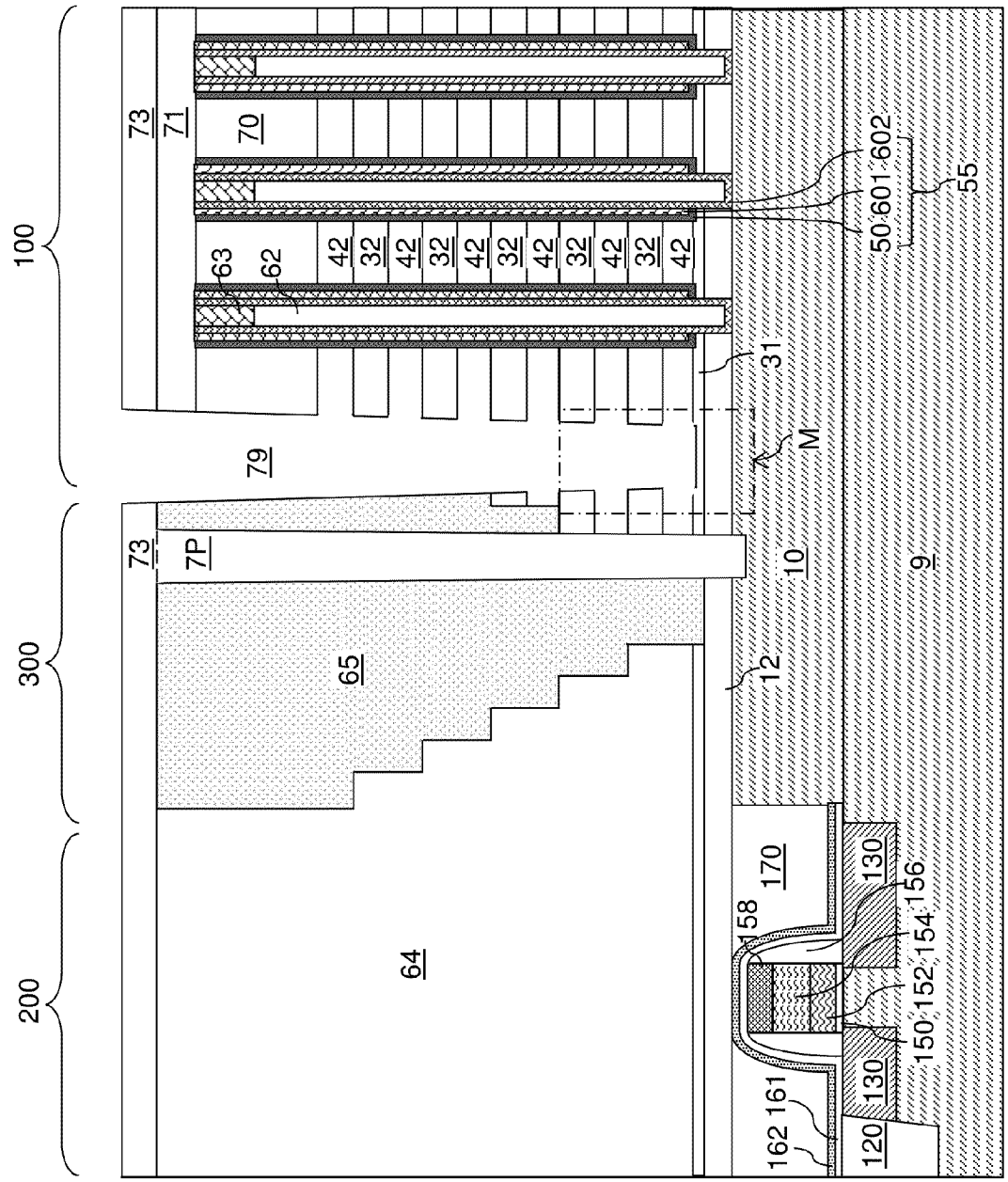
FIG. 5A is a vertical cross-sectional view of the exemplary structure after formation of a backside via cavity and backside recesses according to an embodiment of the present disclosure.
Figure 5B:
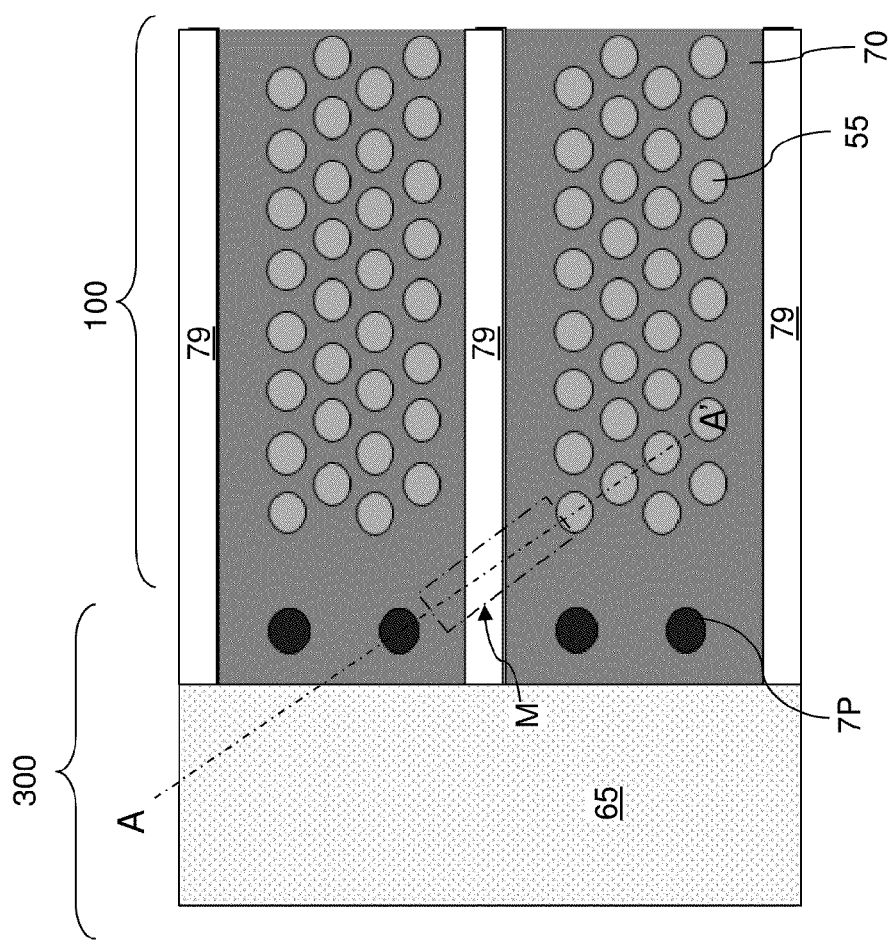
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to a plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and optionally to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the dielectric pillar material layer 73 and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79. The backside contact trench 79 can be formed through the stack (32, 42) employing the high-k dielectric material layer 31 as an etchstop layer. The bottom surface of the backside contact trench 79 can be coplanar with the topmost surface of the high-k dielectric material layer 31, or can be vertically recessed relative to the topmost surface of the high-k dielectric material layer 31 by a vertical distance that is less than the thickness of the high-k dielectric material layer 31.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the high-k dielectric material layer 31, the material of the at least one dielectric support pillar 7P, the material of the retro-stepped dielectric material portion 65, the semiconductor material of the semiconductor material layer 10, and the material of the plurality of blocking dielectric portions 501. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses 43.

Figure 6A:
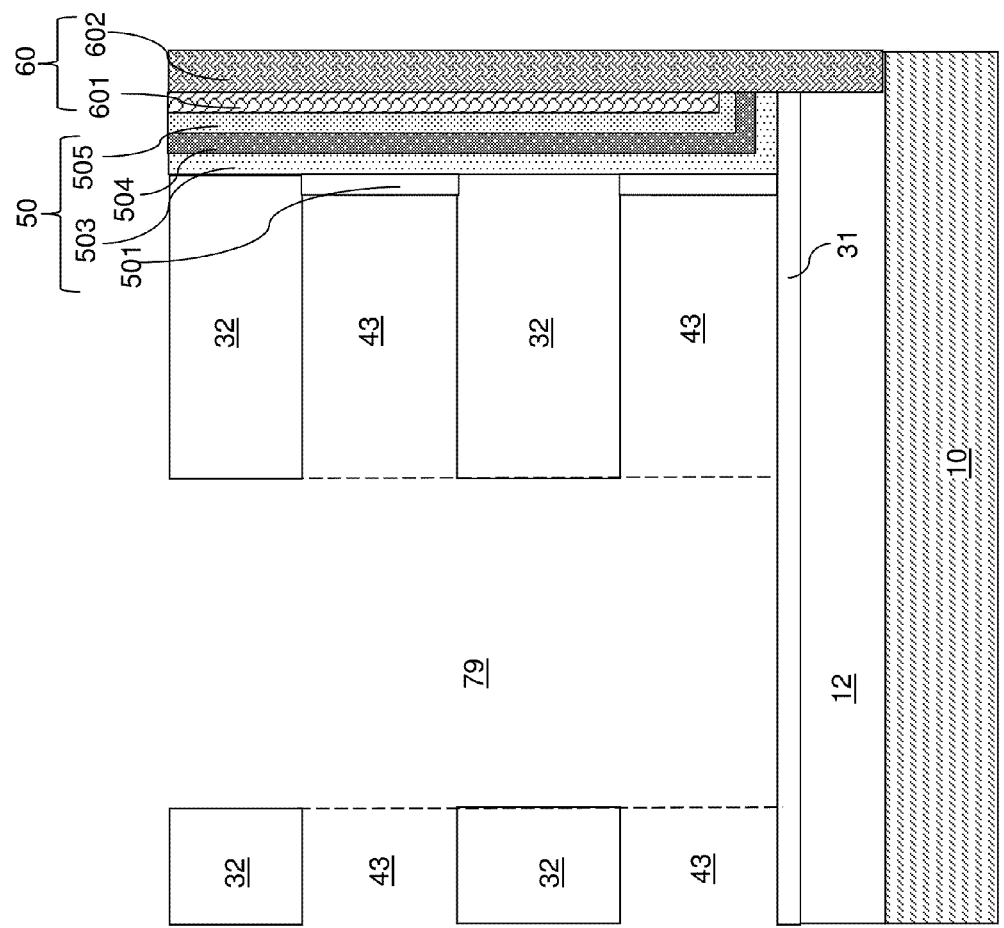

Referring to FIG. 6A, a vertical cross-sectional view of a magnified region M in FIGS. 5A and 5B is shown after formation of the backside recesses 43.

Referring to FIG. 6B, the portion of the high-k dielectric material layer 31 that underlies a bottommost backside recess 43 among the backside recesses 43 can be removed selective to the plurality of blocking dielectric portions 501. In one embodiment, the portion of the high-k dielectric material layer 31 directly underneath the bottommost backside recess 43 can be removed by an isotropic etch such as a wet etch. The etch chemistry for etching the high-k dielectric material layer 31 can be selected based on the material of the high-k dielectric material layer 31. In an illustrative example, if the high-k dielectric material layer 41 includes aluminum oxide, a wet etch chemistry employing a mixture of $NH_4OH$, $H_2O_2$, and $H_2O$ or a wet etch chemistry employing $Br_2$, $CH_3OH$ and $H_2O$ can be employed.

In one embodiment, a peripheral sub-portion of a horizontal portion of the high-k dielectric material layer 31 underlying the memory film 50 can be undercut during the removal of the portion of the high-k dielectric material layer 31 that underlies the bottommost backside recess 43. Alternatively, a selective, anisotropic aluminum oxide etch may be used instead.

Figure 6C:
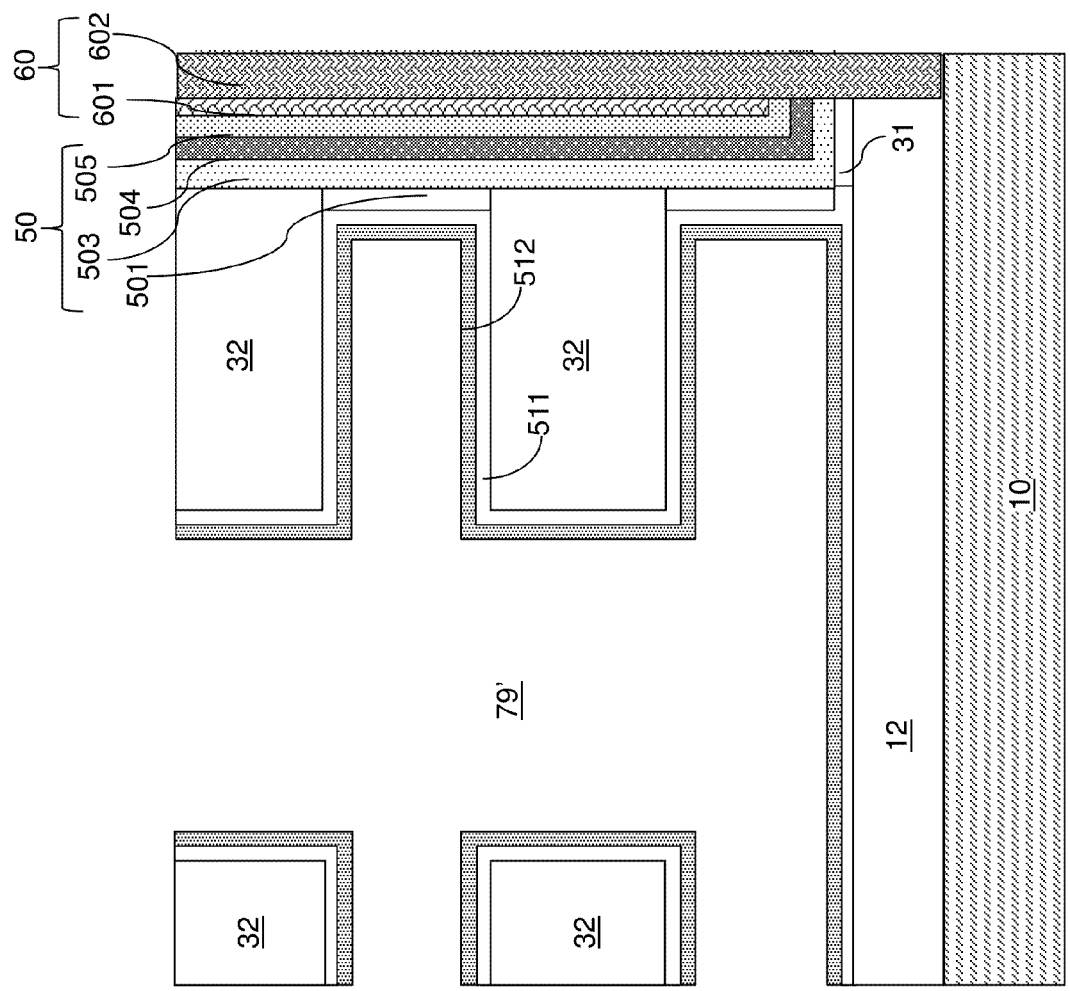

Referring to FIG. 6C, at least one backside blocking dielectric layer (511, 512) can be formed conformally within a contiguous cavity (79, 43) including the volume of the backside contact trench 79 and the backside recesses 43. In one embodiment, the at least one backside blocking dielectric layer (511, 512) can include a first backside blocking dielectric layer 511 comprising silicon oxide, and a second backside blocking dielectric material 512 comprising a high-k dielectric material. In one embodiment, the first backside blocking dielectric layer 511 can be a silicon oxide layer, and the second backside blocking dielectric layer 512 can be an additional high-k dielectric material layer. In another embodiment, the first backside blocking dielectric layer 511 can be an additional high-k dielectric material layer, and the second backside blocking dielectric layer 512 can be a silicon oxide layer. The high-k dielectric material of the additional high-k dielectric material layer can be the same as, or can be different from, the high-k dielectric material of the high-k dielectric material layer 31. Each of the first and second backside blocking dielectric layers (511, 512) can have a thickness in a range from 1 nm to 15 nm, although lesser and greater thicknesses can also be employed. A contiguous cavity 79' including unfilled portions of the backside contact trench 79 and backside recesses 43 is present after formation of the at least one blocking dielectric layer (511, 512).

Figure 6D:
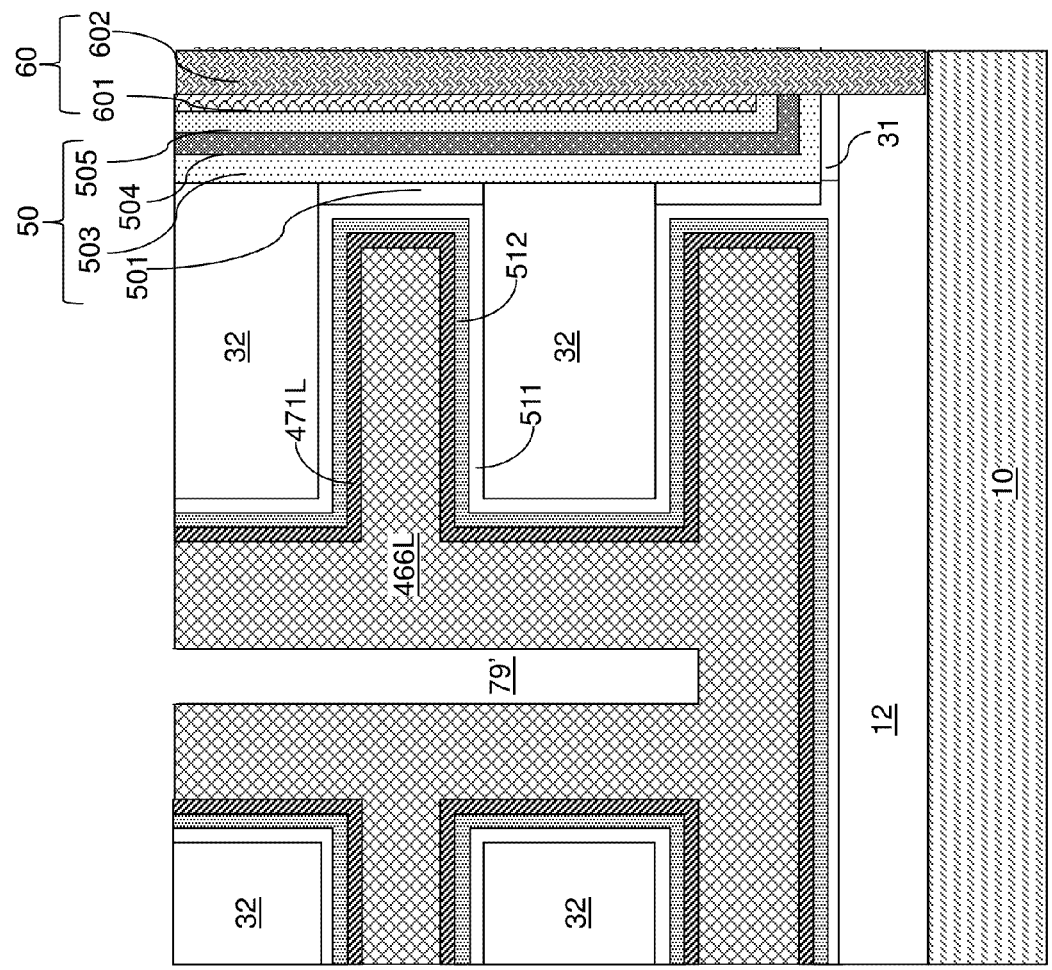

Referring to FIG. 6D, at least one conductive material can be deposited in the contiguous cavity 79'. Specifically, the at least one conductive material can be deposited in unfilled volumes of the plurality of backside recesses 43, at a periphery of the backside contact trench 79 (i.e., on the sidewalls of the backside contact trench 79), and over the top surface of the dielectric pillar material layer 73 (or the topmost layer of the exemplary structure in case the dielectric pillar material layer 73 is not employed). As used herein, a conductive material refers to an electrically conductive material. Each of the at least one conductive material can be deposited by a conformal deposition method, which can be, for example, chemical vapor deposition (CVD), atomic layer deposition (ALD), electroless plating, electroplating, or a combination thereof. Each of the at least one conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

In one embodiment, the at least one conductive material can include a first conductive material including a conductive metallic nitride (e.g., diffusion barrier layer), and a second conductive material including an elemental metal or an intermetallic alloy of at least two elemental metals. The first conductive material can be deposited to form a contiguous metallic layer 471L including the conductive metallic nitride. In one embodiment, the contiguous metallic layer 471L can include TiN, TaN, WN, or a combination or and alloy thereof. The second conductive material can be deposited to form a conductive fill material layer 466L including an elemental metal or an intermetallic alloy of at least two metallic elements. In one embodiment, the conductive fill material layer 466 can include W, Cu, Au, Ag, Pt, or a combination thereof. The duration of the deposition process that forms the conductive fill material layer 466L can be selected such that all remaining unfilled volumes of the backside recesses 43 are filled with the conductive material of the conductive fill material layer 466L, while a contiguous cavity 79' is optionally present within an unfilled volume of the backside contact trench after the deposition process.

Figure 6E:
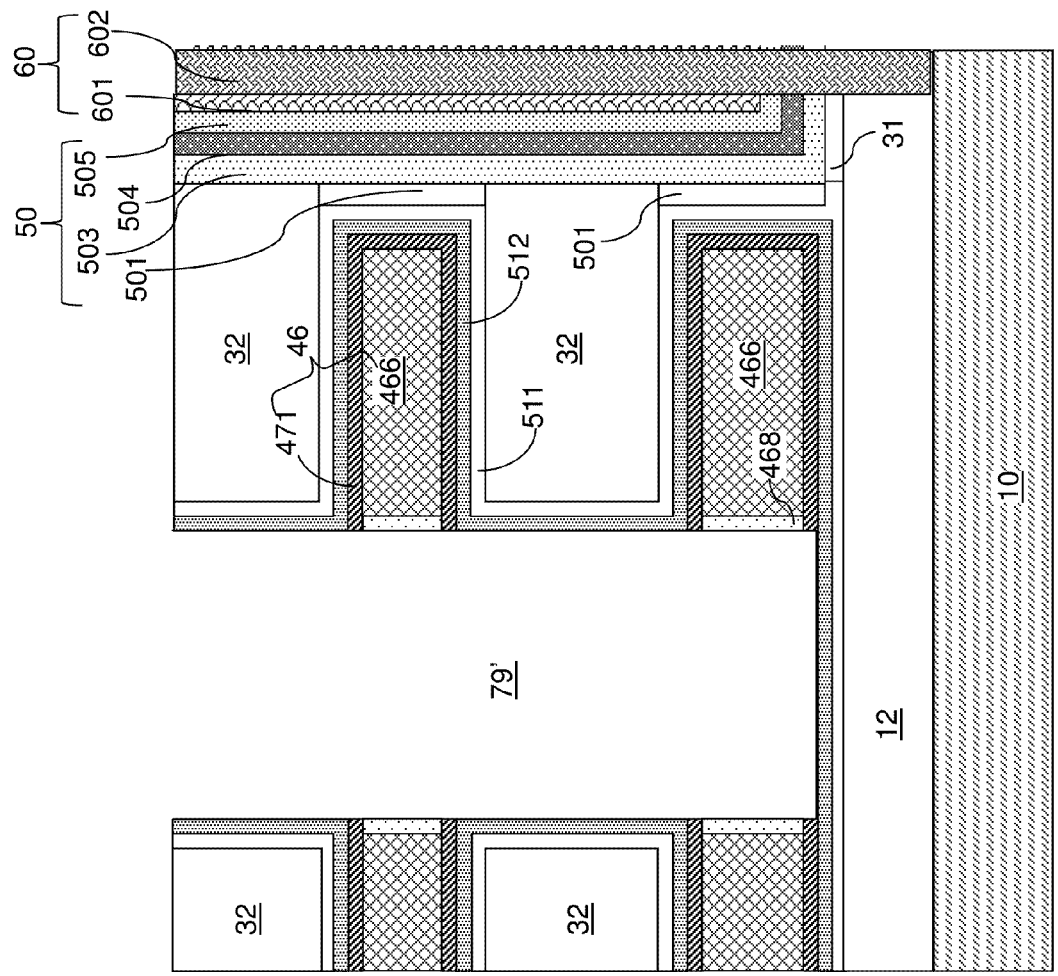

Referring to FIG. 6E, the deposited conductive materials of the contiguous metallic layer 471L and the conductive fill material layer 466L can be etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the contiguous metallic layer 471L in a backside recess 43 constitutes a metallic liner (e.g., diffusion bather) 471. Each remaining portion of the conductive fill material layer 466L in a backside recess 43 constitutes a conductive material portion 466. Each adjoining pair of a metallic liner 471 and a conductive material portion 466 constitutes an electrically conductive layer 46. Each electrically conductive layer 46 can be a conductive line structure.

The anisotropic etch process etches portions of the deposited at least one conductive material from the periphery of the backside contact trench 79. Remaining portions of the at least one conductive material in the backside recesses 43 constitute the electrically conductive layers 46. A plurality of electrically conductive layers 46 can be formed in the plurality of backside recesses 43. Thus, at least a portion of each sacrificial material layer 42 can be replaced with an electrically conductive layer 46, which is a conductive material portion. In one embodiment, the anisotropic etch process that removes portions of the contiguous metallic layer 471L and the conductive fill material layer 466L from the sidewalls of each backside contact trench 79 may be selective to the second backside blocking dielectric layer 512, a first backside blocking dielectric layer 511, or the dielectric pad layer 12.

Optionally, metal oxide portions 468 can be formed by converting the conductive material in the surface portions of the conductive material portions 466 into a dielectric material. For example, in the conductive material portions 466 include elemental tungsten, surface portions of the conductive material portions 466 can be converted into tungsten oxide portions.

In the structure of FIG. 6E, a periphery of the high-k dielectric material layer 31 can be laterally recessed inward from an outer sidewall of a bottommost blocking dielectric portion 501 among the plurality of blocking dielectric portions 501. A sidewall of the semiconductor channel 60 is in contact with a sidewall of the high-k dielectric material layer 31 at the opening.

Figure 7:
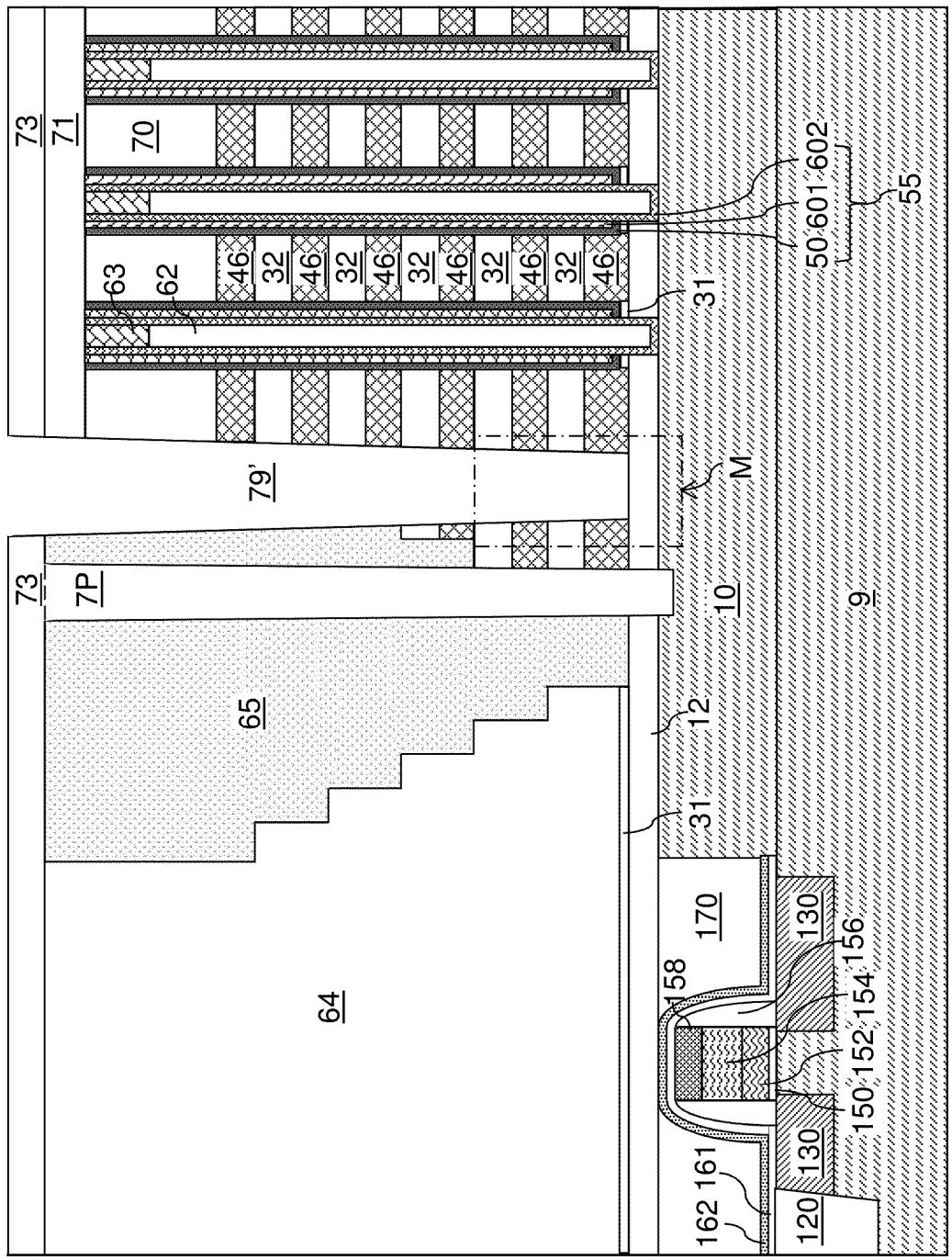
FIG. 7 is a vertical cross-sectional view of the exemplary structure after formation of electrically conductive lines according to an embodiment of the present disclosure.

FIG. 7 is a vertical cross-sectional view of the exemplary structure after formation of electrically conductive layers 46 according to an embodiment of the present disclosure. Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 8A:
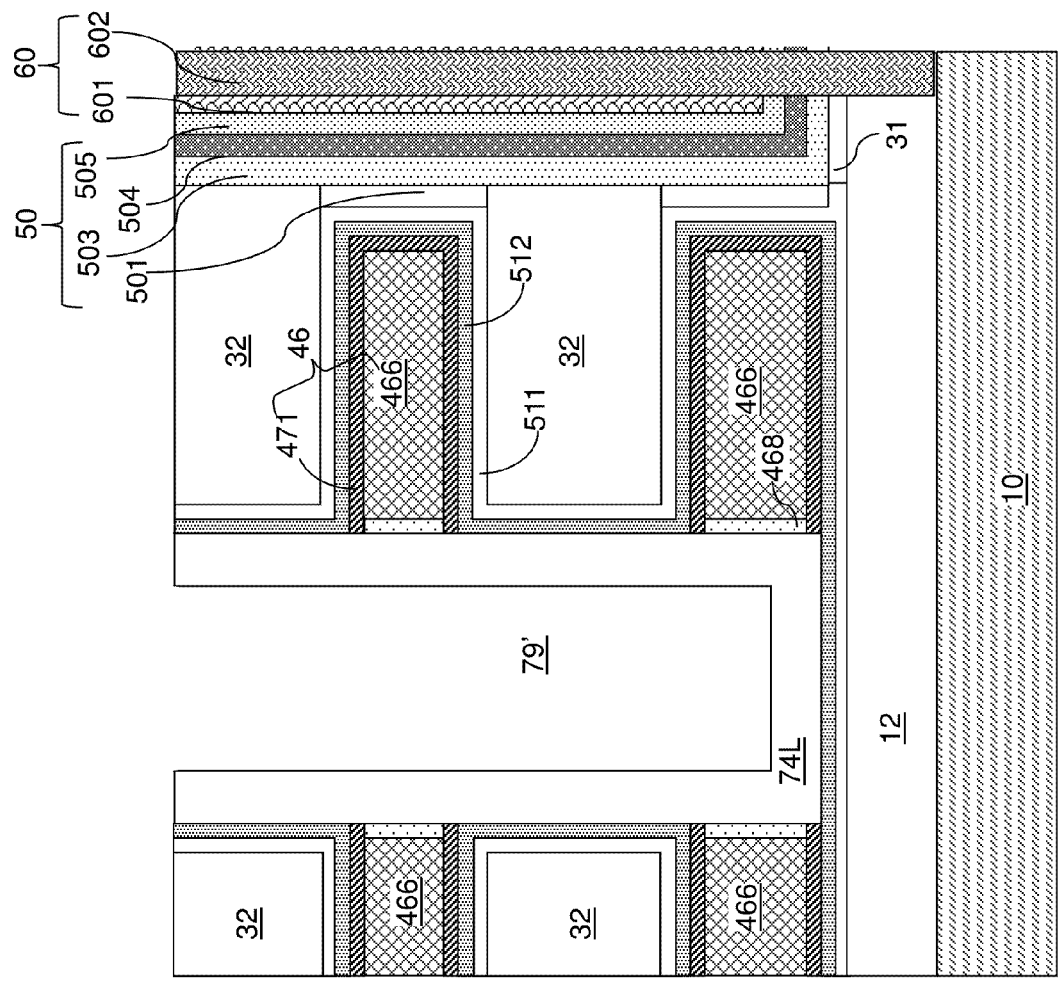
FIGS. 8A-8C are sequential vertical cross-sectional views of a magnified region M in FIG. 7 during formation of a source contact via structure according to an embodiment of the present disclosure.

Referring to FIG. 8A, a vertical cross-sectional view of a magnified region M of FIG. 7 is shown after formation of an insulating layer 74L. In one embodiment, the insulating layer 74L includes a dielectric material such as silicon oxide, silicon nitride, organosilicate glass, a dielectric metal oxide, a dielectric metal oxynitride, or a combination thereof. In one embodiment, the insulating layer 74L can comprise a silicon oxide layer. The insulating layer 74L can be formed by a conformal deposition method such as chemical vapor deposition or atomic layer deposition. The thickness of the insulating layer 74L can be in a range from 5 nm to 100 nm, although lesser and greater thicknesses can also be employed.

Figure 8B:
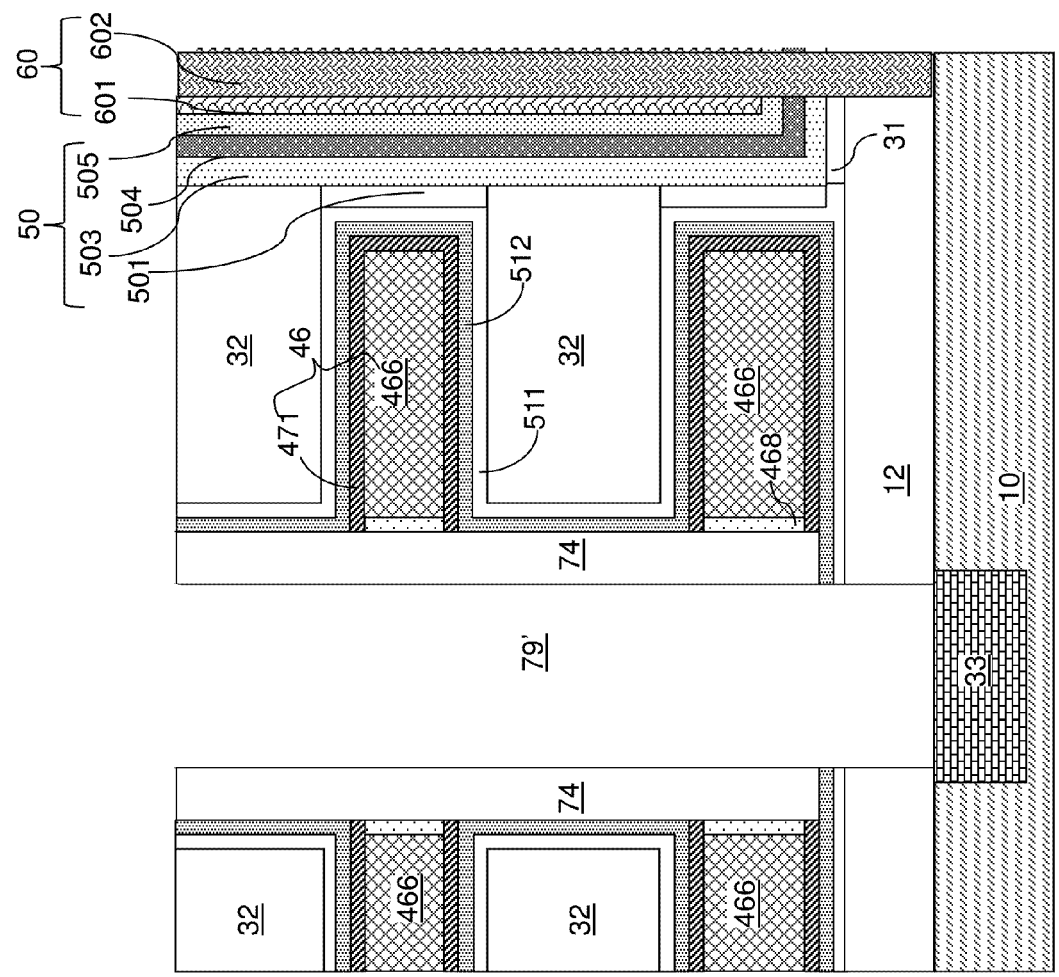

Referring to FIG. 8B, an anisotropic etch is performed to remove horizontal portions of the insulating layer 74L. The remaining vertical portion of the insulating layer 74L located at the periphery of the backside contact cavity 79 constitutes an insulating spacer 74. Thus, the insulating spacer 74 is formed on the sidewalls of the backside contact trench 79 by deposition of a contiguous dielectric material layer and an anisotropic etch of its horizontal portions.

The anisotropic etch can be continued with, or without, a change in the etch chemistry to etch the portions of the at least one backside blocking dielectric layer (511, 512) and the dielectric pad layer 12 from underneath the contiguous cavity 79'. The contiguous cavity 79' within the insulating spacer 74 is vertically extended through the at least one backside blocking dielectric layer (511, 512) and the dielectric pad layer 12 so that a top surface of the substrate (9, 10) is physically exposed at the bottom of the vertically extended contiguous cavity 79' after the anisotropic etch process.

Optionally, a source region 33 can be formed in a surface portion of the substrate (9, 10) that underlies the contiguous cavity 79' by introducing electrical dopants through the top surface of the substrate (9, 10). The electrical dopants can be p-type dopants such as B, Ga, and In, or can be n-type dopants such as P, As, and Sb. In one embodiment, the electrical dopants can be introduced by ion implantation and/or by plasma doping. The polarity of the electrical dopants introduced to form the source region 33 can be opposite to the conductivity type of the semiconductor material layer 10.

Figure 8C:
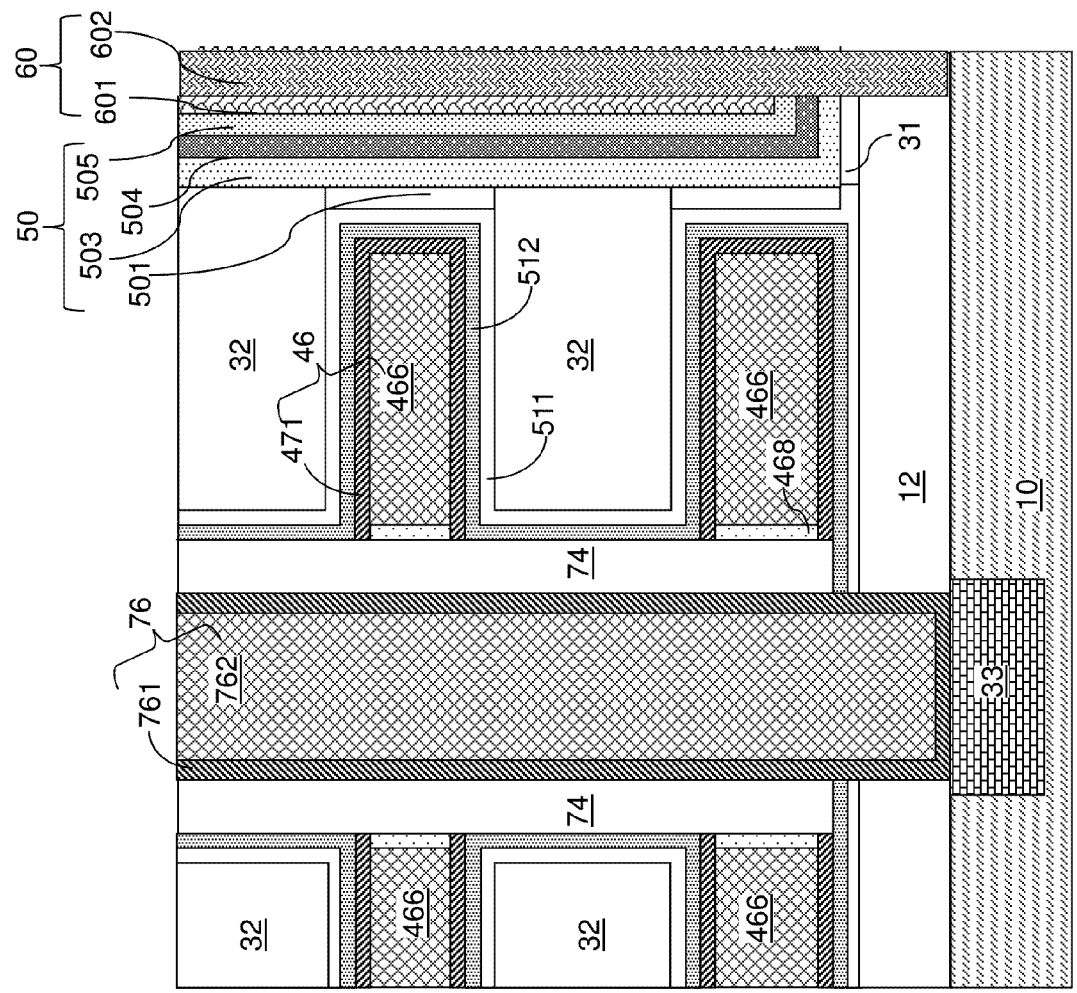

Referring to FIG. 8C, at least one conductive material can be deposited in the contiguous cavity 79'. The at least one conductive material can include a conductive metallic nitride material, an elemental metal, an intermetallic alloy of at least one elemental metal, a metal semiconductor alloy such as a metal silicide, a doped semiconductor material, or a combination thereof. In one embodiment, the at least one conductive material can include a combination of a conductive metallic nitride material (e.g., diffusion barrier material) and a metallic material including at least one elemental metal. The at least one conductive material can be deposited, for example, by physical vapor deposition, chemical vapor deposition, electroplating, electroless plating, or a combination thereof. The at least one conductive material can fill the contiguous cavity 79' in the backside contact trench 79.

Excess portions of the at least one conductive material can be removed from above the topmost layer of the exemplary structure (which can be, for example, the dielectric pillar material layer 73), for example, by chemical mechanical planarization. The remaining portion of the at least one conductive material that is surrounded by the insulating spacer 74 and filling the contiguous cavity 79' constitutes a source contact via structure 76, which is a contact via structure that provides electrical contact to the source region 33. In one embodiment, the source contact via structure 76 can comprise a source contact metallic liner 761 including a conductive metallic nitride and a source contact via fill portion 762 including an elemental metal or an intermetallic alloy of at least two elemental metals. In one embodiment, the source contact metallic liner 761 can include titanium nitride, and the source contact via fill portion 762 can include tungsten. In one embodiment, the source contact via structure 76 can contacts a sidewall of an opening in the dielectric pad layer 12, i.e., the opening of the dielectric pad layer 12 as formed at a processing step of FIG. 8B. In one embodiment, the sidewall of the opening of the dielectric pad layer 12 can be vertically coincident with an inner sidewall of the insulating spacer 74. The at least one backside blocking dielectric layer (511, 512) contacts each of the electrically conductive layers 46, the memory film 50, and the source contact via structure 76.

Figure 9:
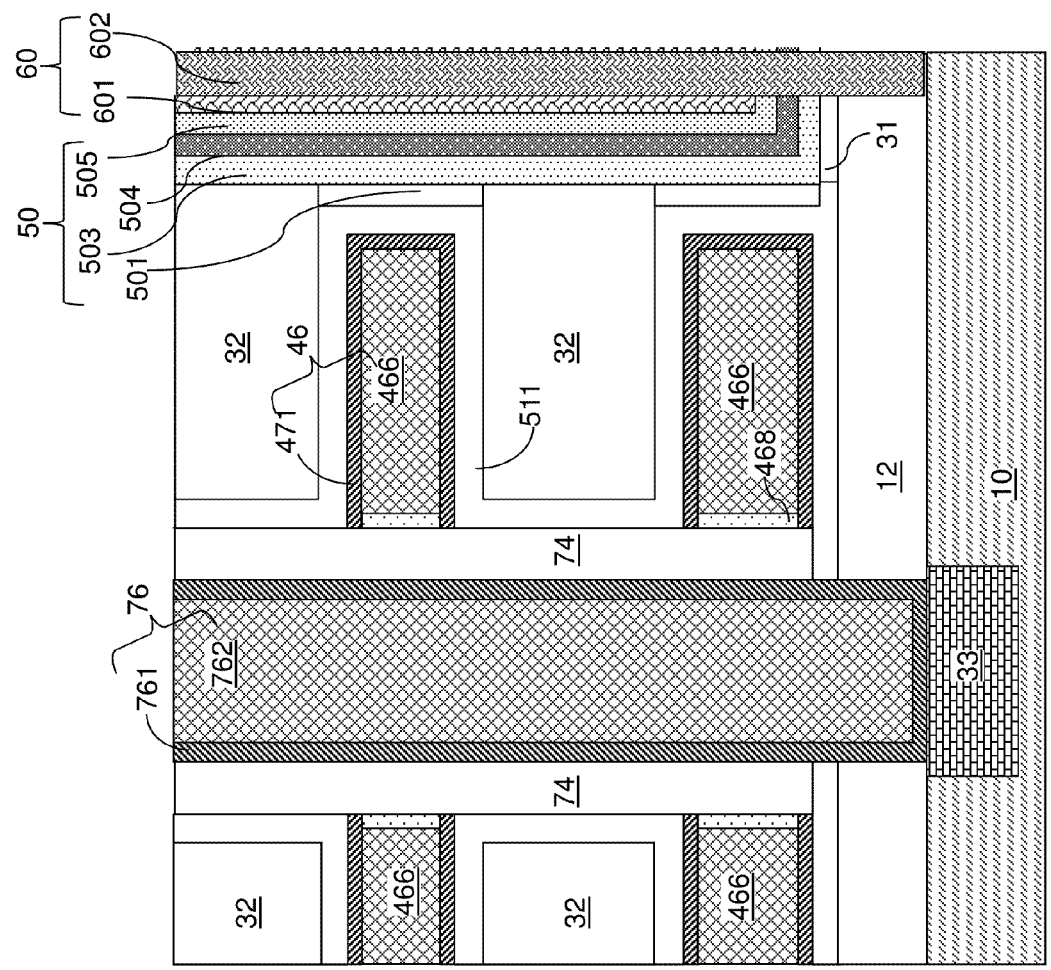
FIG. 9 is a vertical cross-sectional view of the magnified region M in FIG. 7 after formation of electrically conductive layers and a source contact via structure according to a second embodiment of the present disclosure.

Referring to FIG. 9, an alternative embodiment of the magnified region M of the exemplary structure is shown, which can be derived from the exemplary structure illustrated in FIG. 6B by modifying the processing steps for forming the at least one backside blocking dielectric layer (511, 512). Specifically, the at least one backside blocking dielectric layer (511, 512) illustrated in FIG. 6C is formed as a single layer including the first backside blocking dielectric layer 511 only, which is herein referred to as the backside blocking dielectric layer 511. In one embodiment, the backside blocking dielectric layer 511 can include silicon oxide, i.e., can be a silicon oxide layer. The thickness of the backside blocking dielectric layer 511 can be in a range from 2 nm to 20 nm, although lesser and greater thicknesses can also be employed. The processing steps of FIGS. 6D, 6E, and 8A-8C can be subsequently performed to form the alternate embodiment of the exemplary structure illustrated in FIG. 9. The backside blocking dielectric layer 511 contacts each of the electrically conductive layers 46, the memory film 50, and the source contact via structure 76.

Figure 10:
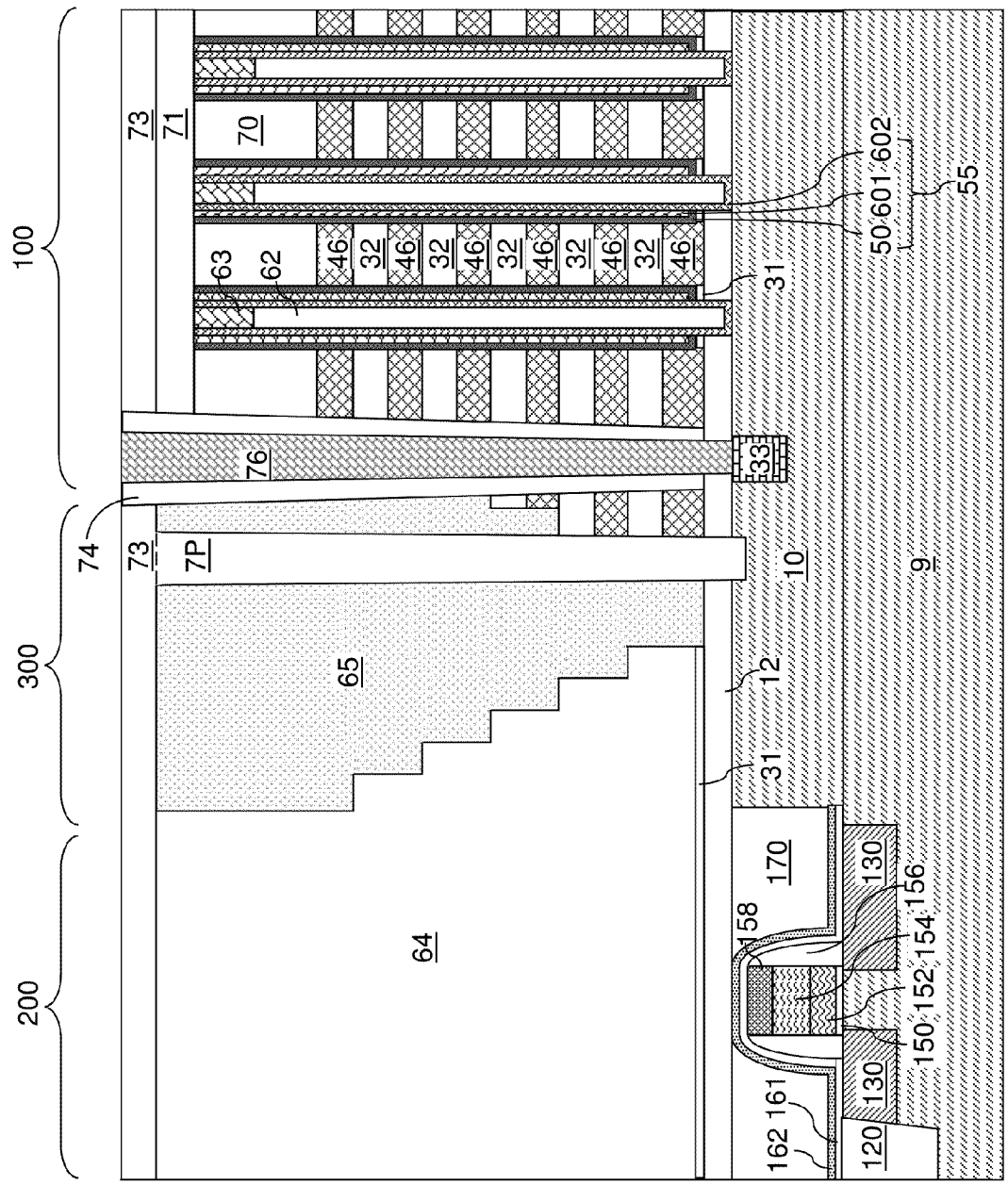
FIG. 10 is a vertical cross-sectional view of the exemplary structure after formation of a backside via insulating spacer and a backside contact via structure according to an embodiment of the present disclosure.

FIG. 10 illustrates the exemplary structure after completion of the processing steps illustrated in FIG. 8C or in FIG. 9.

Figure 11A:
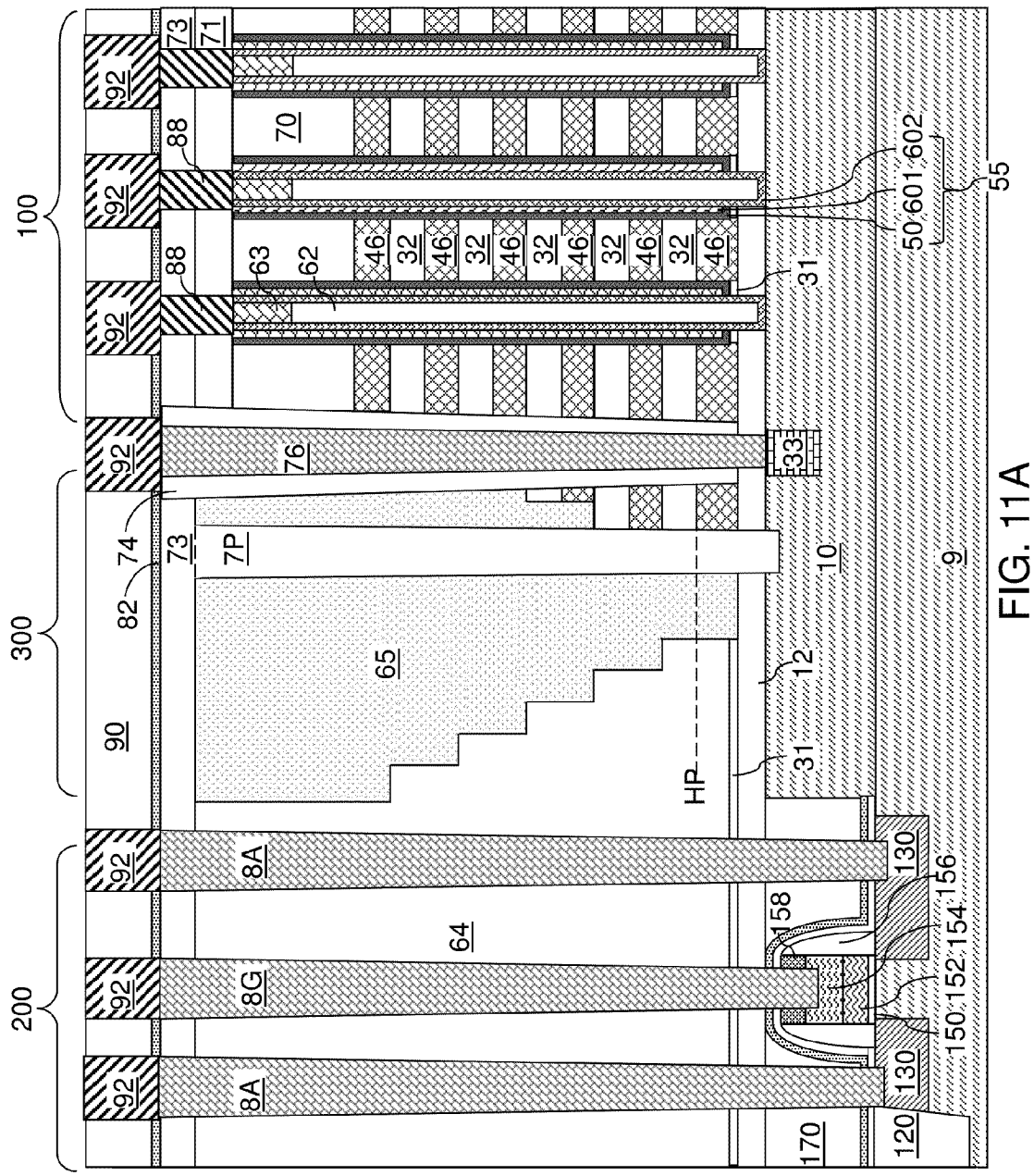
FIGS. 11A and 11B are vertical cross-sectional views of regions of the exemplary structure after formation of conductive line structures according to an embodiment of the present disclosure.
Figure 11B:
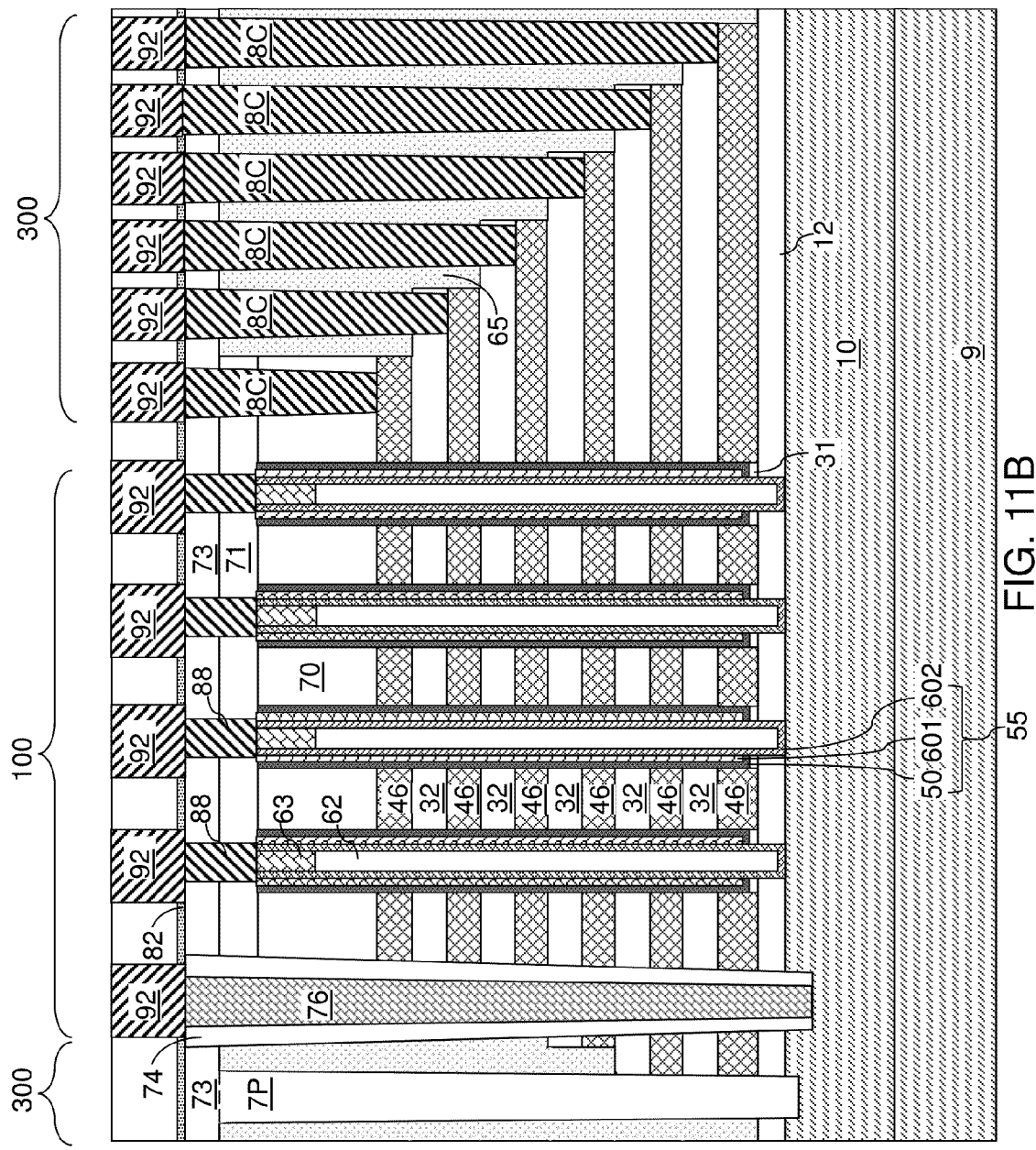

Referring to FIGS. 11A and 11B, various additional contact via structures (8A, 8G, 88, 8C) can be formed through the dielectric material portion 64, dielectric pillar material layer 73 and the at least one dielectric cap layer 71 and optionally through the insulating cap layer 70, or the retro-stepped dielectric material portion 65 to provide electrical contact to various nodes of the semiconductor devices on the substrate (9, 10). The formation of the various additional contact via structures (8A, 8G, 88, 8C) may be performed prior to, concurrently with, or after formation of the source contact via structures 76. The additional contact via structures (8A, 8G, 88, 8C) can include at least one gate contact via structure 8G, at least one active region contact via structure 8A, drain contact via structures 88, and control gate contact via structures 8C. Each gate contact via structure 8G can provide electrical contact to a gate electrode of field effect transistors in a peripheral device region. Each active region contact via structure 8A can provide electrical contact to an active region (such as a source region or a drain region) of field effect transistors in the peripheral device region. Each drain contact via structures 88 can provide electrical contact to drain regions 63 of the vertical field effect transistors that incorporate the memory stack structures 55. Each control gate contact via structures 8C contacts an electrically conductive layer 46, which can function as a control gate electrode for the vertical field effect transistors that incorporate the memory stack structures 55.

Each of the additional contact via structures (8A, 8G, 88, 8C) can be fabricated by forming contact via cavities through the dielectric material portion 64, dielectric pillar material layer 73 and the at least one dielectric cap layer 71 and optionally through the insulating cap layer 70, or the retro-stepped dielectric material portion 65, and by filling the contact via cavities with at least one conductive material. Each contact via cavity can be formed by application of a photoresist layer over the exemplary structure, lithographic patterning of the photoresist layer, and transfer of the lithographic pattern into underlying dielectric material layers and/or portions employing an anisotropic etch. After removal of the photoresist layer, at least one conductive material is deposited within the patterned via cavities by physical vapor deposition (PVD), chemical vapor deposition (CVD), electroplating, electroless plating, or a combination thereof. Multiple types of via cavities may be filled simultaneously. In one embodiment, the at least one conductive material that is deposited in the backside contact trenches 79 may be deposited in at least another type of contact via cavities simultaneously. The excess conductive material above the topmost surface of the exemplary structure (such as the top surface of the dielectric pillar material layer 73) can be removed, for example, by chemical mechanical planarization. Each remaining portion of the conductive material constitutes a contact via structure (8A, 8G, 88, or 8C).

An optional passivation layer 82 and a line-level dielectric layer 90 can be formed over the dielectric pillar material layer 73. The optional passivation layer 82 can include a low permeability material such as silicon nitride. As used herein, a low permeability material refers to a material that has hydrogen permeability at room temperature that is less than 100 times the hydrogen permeability of stoichiometric silicon nitride formed by low pressure chemical vapor deposition. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

The exemplary structure is a monolithic three-dimensional memory device, and includes a high-k dielectric material layer 31 having a dielectric constant greater than 7.9 and located over a substrate (9, 10), and a stack of alternating layers comprising insulator layers 32 and electrically conductive layers 46 and located over the high-k dielectric material layer 31, a memory opening extending through the stack (32, 46), and a memory film 50 and a semiconductor channel 60 located within the memory opening. The memory film 50 is in contact with a top surface of the high-k dielectric material layer 31. A portion of the semiconductor channel 60 extends through an opening in the high-k dielectric material layer 31 and contacts a semiconductor material within the substrate (9, 10). The high-k dielectric material layer 31 can be a horizontal layer having a topmost surface located below a horizontal plane HP including a top surface of a bottommost electrically conductive layer 46 within the stack (32, 46). The memory film 50 can comprise a blocking dielectric layer 501 extending through the stack (32, 46) and including a horizontal portion having a bottom surface that contacts a top surface of the high-k dielectric material layer 31. A sidewall of the high-k dielectric material layer 31 at the opening can be vertically coincident with a sidewall of the blocking dielectric layer 501 as illustrated in FIG. 2F. The memory film 50 can comprise a plurality of blocking dielectric portions 501 having an annular shape, contacting the blocking dielectric layer 503, and surrounding the blocking dielectric layer 503.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
   a high dielectric constant (high-k) dielectric material layer having a dielectric constant greater than 7.9 and located over a substrate;
   a stack of alternating layers comprising insulator layers and electrically conductive layers and located over the high-k dielectric material layer;
   a memory opening extending through the stack; and
   a memory film and a semiconductor channel located within the memory opening, wherein:
   the memory film is in contact with a top surface of the high-k dielectric material layer; and
   a portion of the semiconductor channel extends through an opening in the high-k dielectric material layer and contacts a semiconductor material within the substrate.

2. The monolithic three-dimensional memory device of claim 1, wherein the high-k dielectric material layer comprises a dielectric metal oxide.

3. The monolithic three-dimensional memory device of claim 1, wherein the high-k dielectric material layer comprises an aluminum oxide layer.

4. The monolithic three-dimensional memory device of claim 1, wherein the high-k dielectric material layer is a horizontal layer having a topmost surface located below a horizontal plane including a top surface of a bottommost electrically conductive layer within the stack.

5. The monolithic three-dimensional memory device of claim 1, wherein the memory film comprises a blocking dielectric layer extending through the stack and including a horizontal portion having a bottom surface that contacts a top surface of the high-k dielectric material layer.

6. The monolithic three-dimensional memory device of claim 5, wherein a sidewall of the high-k dielectric material layer at the opening is vertically coincident with a sidewall of the blocking dielectric layer.

7. The monolithic three-dimensional memory device of claim 5, wherein the memory film further comprises a plurality of blocking dielectric portions having an annular shape, contacting the blocking dielectric layer, and surrounding the blocking dielectric layer.

8. The monolithic three-dimensional memory device of claim 7, wherein a periphery of the high-k dielectric material layer is laterally recessed inward from an outer sidewall of a bottommost blocking dielectric portion among the plurality of blocking dielectric portions.

9. The monolithic three-dimensional memory device of claim 5, wherein the memory film further comprises:
   at least one charge storage element located on an inner sidewall of the blocking dielectric layer; and
   a tunneling dielectric contacting the at least one charge storage element and the semiconductor channel.

10. The monolithic three-dimensional memory device of claim 1, wherein a sidewall of the semiconductor channel is in contact with a sidewall of the high-k dielectric material layer at the opening.

11. The monolithic three-dimensional memory device of claim 1, further comprising:
   a source region located within the substrate; and
   a source contact via structure extending through the stack and contacting the source region.

12. The monolithic three-dimensional memory device of claim 11, further comprising an insulating spacer extending through the stack and laterally surrounding the source contact via structure.

13. The monolithic three-dimensional memory device of claim 12, further comprising at least one backside blocking dielectric layer contacting each of the electrically conductive layers and the insulating spacer.

14. The monolithic three-dimensional memory device of claim 13, wherein the backside blocking dielectric layer comprises a silicon oxide layer.

15. The monolithic three-dimensional memory device of claim 13, wherein the backside blocking dielectric layer comprises an additional high-k dielectric material layer.

16. The monolithic three-dimensional memory device of claim 12, further comprising a dielectric pad layer located over the substrate and including an opening therein, wherein the insulating spacer contacts a sidewall of the opening of the dielectric pad layer.

17. The monolithic three-dimensional memory device of claim 16, wherein the sidewall of the opening of the dielectric pad layer is vertically coincident with an inner sidewall of the insulating spacer.

18. The three-dimensional memory device of claim 1, wherein:
   the three-dimensional memory device comprises a vertical NAND device located in a device region; and
   the electrically conductive layers comprise, or are electrically connected to a respective word line of the NAND device.

19. The three-dimensional memory device of claim 18, wherein:
   the device region comprises:
      a plurality of semiconductor channels, wherein at least one end portion of each of the plurality of semiconductor channels extends substantially perpendicular to a top surface of the substrate;
      a plurality of charge storage regions, each charge storage region located adjacent to a respective one of the plurality of semiconductor channels; and
      a plurality of control gate electrodes having a strip shape extending substantially parallel to the top surface of the substrate;
   the plurality of control gate electrodes comprise at least a first control gate electrode located in a first device level and a second control gate electrode located in a second device level;
   the electrically conductive layers in the stack are in electrical contact with the plurality of control gate electrode and extend from the device region to a contact region including the plurality of electrically conductive via connections; and
   the substrate comprises a silicon substrate containing a driver circuit for the NAND device.

20. A method of manufacturing a three-dimensional memory structure, comprising:
   forming a high dielectric constant (high-k) dielectric material layer having a dielectric constant greater than 7.9 over a substrate;
   forming a stack of alternating layers comprising first material layers and second material layers over the high-k dielectric material layer;
   forming a memory opening through the stack employing the high-k dielectric material layer as an etchstop layer;
   forming a memory film in the memory opening;
   forming an extension of the memory opening by an anisotropic etch of the high-k dielectric material layer employing at least the memory film as an etch mask, wherein the extension of the memory opening extends to the substrate; and
   forming a semiconductor channel on the memory film, wherein the semiconductor channel extends through the extension opening in the high-k dielectric material layer and contacts the substrate.

21. The method of claim 20, further comprising forming a backside opening through the stack employing the high-k dielectric material layer as an etchstop layer.

22. The method of claim 20, wherein the memory film is formed directly on a top surface of the high-k dielectric material layer.

23. The method of claim 20, wherein forming the high-k dielectric material layer comprises depositing a dielectric metal oxide layer.

24. The method of claim 20, wherein forming the high-k dielectric material layer comprises depositing an aluminum oxide layer.

25. The method of claim 20, wherein a bottommost surface of the stack is formed on a topmost surface of the high-k dielectric material layer.

26. The method of claim 20, wherein forming the memory film comprises forming a blocking dielectric layer directly on a top surface of the high-k dielectric material layer employing a conformal deposition method.

27. The method of claim 26, wherein the second material layers comprise silicon nitride, and the method further comprises forming a plurality of blocking dielectric portions comprising a silicon oxynitride or silicon oxide and having an annular shape around the memory opening prior to formation of the blocking dielectric layer.

28. The method of claim 26, wherein forming the memory film further comprises:
   forming at least one charge storage element on an inner sidewall of the blocking dielectric layer; and forming a tunneling dielectric directly on the at least one charge storage element.

29. The method of claim 20, further comprising:
forming a backside contact trench through the stack employing the high-k dielectric material layer as an etchstop layer; and
removing the second material layers by introducing an etchant that etches the second material layers through the backside contact trench, wherein backside recesses are formed in volumes previously occupied by the second material layers.

30. The method of claim 29, further comprising removing a portion of the high-k dielectric material layer that underlies a bottommost backside recess among the backside recesses.

31. The method of claim 30, wherein a peripheral subportion of a horizontal portion of the high-k dielectric material layer underlying the memory film is undercut during the removal of the portion of the high-k dielectric material layer that underlies the bottommost backside recess.

32. The method of claim 30, further comprising:
depositing at least one conductive material in the backside recesses and at a periphery of the backside contact trench; and
removing a portion of the deposited at least one conductive material from the periphery of the backside contact trench, wherein remaining portions of the at least one conductive material in the backside recesses constitute electrically conductive layers.

33. The method of claim 32, further comprising:
forming an insulating spacer at the periphery of the backside contact trench after formation of the electrically conductive layers;
extending a cavity within the insulating spacer vertically to a top surface of the substrate by an anisotropic etch;
forming a source region in the substrate underneath the vertically extended cavity; and
forming a source contact via structure in the vertically extended trench.

34. The method of claim 32, further comprising forming at least one backside blocking dielectric layer within the backside recesses prior to depositing the at least one conductive material, wherein the at least one backside blocking dielectric layer comprises at least one of a silicon oxide layer and an additional high-k dielectric material layer.

35. The method of claim 32, further comprising forming a stack of a silicon oxide layer and an additional high-k dielectric material layer within the backside recesses prior to depositing the at least one conductive material.

36. The method of claim 20, further comprising forming a device on the substrate by replacing the second material layers with electrically conductive portions, wherein:
the device comprises a vertical NAND device; and
at least one of the electrically conductive portions in the stack comprises, or is electrically connected to, a word line of the vertical NAND device.

37. The method of claim 36, wherein:
the NAND device comprises:
a plurality of semiconductor channels, wherein at least one end portion of each of the plurality of semiconductor channels extends substantially perpendicular to a top surface of the semiconductor substrate;
a plurality of charge storage elements, each charge storage element located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in the first device level and a second control gate electrode located in the second device level;
the electrically conductive portions in the stack comprise, or are in electrical contact with, the plurality of control gate electrodes and extend from the device region to a contact region containing the plurality of electrically conductive via connections; and
the substrate comprises a silicon substrate containing a driver circuit for the NAND device.

* * * * *